(12) United States Patent
Furukawa et al.

(10) Patent No.: US 10,312,833 B2
(45) Date of Patent: Jun. 4, 2019

(54) POWER GENERATOR

(71) Applicant: MITSUMI ELECTRIC CO., LTD., Tokyo (JP)

(72) Inventors: Kenichi Furukawa, Sagamihara (JP); Takayuki Numakunai, Tama (JP)

(73) Assignee: MITSUMI ELECTRIC CO., LTD, Tokyo (JP)

(*) Notice: Subject to any disclaimer, the term of this patent is extended or adjusted under 35 U.S.C. 154(b) by 404 days.

(21) Appl. No.: 15/305,314

(22) PCT Filed: Feb. 19, 2015

(86) PCT No.: PCT/JP2015/054671
§ 371 (c)(1),
(2) Date: Oct. 19, 2016

(87) PCT Pub. No.: WO2015/162984
PCT Pub. Date: Oct. 29, 2015

(65) Prior Publication Data
US 2017/0040912 A1 Feb. 9, 2017

(30) Foreign Application Priority Data
Apr. 23, 2014 (JP) .................. 2014-088801

(51) Int. Cl.
*H01L 41/12* (2006.01)
*H02N 2/18* (2006.01)
(Continued)

(52) U.S. Cl.
CPC ............. *H02N 2/18* (2013.01); *H01L 41/125* (2013.01); *H02K 1/34* (2013.01); *H02K 3/28* (2013.01)

(58) Field of Classification Search
CPC ............ H02N 2/00; H02N 2/006; H02N 2/18; H02N 2/186; H01L 41/125
(Continued)

(56) References Cited

U.S. PATENT DOCUMENTS 9,461,237 B2 * 10/2016 Ueno .................... H01L 41/125
2013/0140919 A1 6/2013 Ueno et al.
2014/0333156 A1 * 11/2014 Toyoda ................. H01L 41/125
310/26

FOREIGN PATENT DOCUMENTS

JP 2013-208026 A 10/2013
JP 2013-208028 A 10/2013
(Continued)

OTHER PUBLICATIONS

International Search Report, PCT/JP2015/054671, dated May 19, 2015, 1 page.

*Primary Examiner* — Jeremy A Luks
(74) *Attorney, Agent, or Firm* — Miller Nash Graham & Dunn LLP

(57) ABSTRACT

A power generator 1 includes a magnetostrictive rod 2 through which lines of magnetic force pass in an axial direction thereof, a beam member 73 having a function of generating stress in the magnetostrictive rod 2, and a coil 3 arranged so that the lines of magnetic force pass inside the coil 3 in an axial direction of the coil 3. The beam member 73 is arranged along the magnetostrictive rod 2 and configured to allow one end portion and the other end portion of the magnetostrictive rod 2 to approach to each other to generate compressive stress in the magnetostrictive rod 2. Further, in the power generator 1, it is preferable that a gap between the beam member 73 and the magnetostrictive rod 2 on the side of the one end portion of the magnetostrictive rod 2 is larger than a gap between the beam member 73 and
(Continued)

the magnetostrictive rod 2 on the side of the other one end portion of the magnetostrictive rod 2 in a side view.

8 Claims, 10 Drawing Sheets

(51) Int. Cl.
*H02K 1/34* (2006.01)
*H02K 3/28* (2006.01)

(58) Field of Classification Search
USPC .......................................................... 310/26
See application file for complete search history.

(56) References Cited

FOREIGN PATENT DOCUMENTS

| JP | 2014-033507 A | | 2/2014 |
|----|---------------|---|--------|
| JP | 2014132812 A | * | 7/2014 |
| JP | 2015122855 A | * | 7/2015 |
| WO | 2011158473 A1 | | 12/2011 |

* cited by examiner

POWER GENERATOR

FIELD OF THE INVENTION

The present invention relates to a power generator.

BACKGROUND ART

In recent years, there has been developed a power generator which can generate electric power by utilizing variation of magnetic permeability of a magnetostrictive rod formed of a magnetostrictive material (for example, see patent document 1).

For example, this power generator includes a pair of magnetostrictive rods arranged side by side, two connecting yokes for respectively connecting one end portions and the other end portions of the pair of magnetostrictive rods with each other, coils arranged so as to respectively surround the magnetostrictive rods, two permanent magnets respectively arranged on the two connecting yokes to apply a bias magnetic field to the magnetostrictive rods and a back yoke. The pair of magnetostrictive rods serve as beams facing each other. When external force is applied to one of the connecting yokes in a direction perpendicular to each axial direction of the pair of the magnetostrictive rods, one of the magnetostrictive rods is deformed so as to be expanded and the other one of the magnetostrictive rods is deformed so as to be contracted. At this time, magnetic permeability of each magnetostrictive rod 2 varies. This variation of the magnetic permeability of each magnetostrictive rod 2 leads to variation of density of lines of magnetic force (magnetic flux density) passing through the magnetostrictive rods (that is density of the lines of magnetic force passing through the coils), thereby generating a voltage in the coils.

Generally, the magnetostrictive rod as described above has characteristics that a variation amount (decreasing amount) of the magnetic flux density (magnetic permeability) caused by generation of compressive stress is large while a variation amount (increasing amount) of the magnetic flux density (magnetic permeability) caused by generation of tensile stress is small. Thus, it is difficult to sufficiently vary the magnetic flux density of each of the magnetostrictive rods even if the external power is applied to the power generator to alternately generate the tensile stress and the compressive stress in each of the magnetostrictive rods because the variation amount of the magnetic flux density caused by the tensile stress is small.

Further, the variation amount of the magnetic flux density of each of the magnetostrictive rods is affected by an intensity of the bias magnetic field applied to the magnetostrictive rods. Generally, the variation amount of the magnetic flux density decreases as the intensity of the applied bias magnetic field increases.

Thus, in the power generator disclosed in the patent document 1, if the intensity of the bias magnetic field applied to the magnetostrictive rods is large, it is impossible to sufficiently increase the variation amount of the magnetic flux density of each of the magnetostrictive rods (specifically, it is required to increase the variation amount of the magnetic flux density to about 1 T) without significantly increasing the external force applied to the magnetostrictive rods to sufficiently increase magnitudes of the tensile stress and the compressive stress caused in each of the magnetostrictive rods. Thus, if the intensity of the bias magnetic field applied to the magnetostrictive rods is large, it is difficult for the power generator disclosed in the patent document 1 to efficiently generate the electric power.

RELATED ART

Patent Document

Patent document 1: WO 2011/158473

SUMMARY OF THE INVENTION

Problems to be Solved by the Invention

The present invention has been made in view of the problems mentioned above. Accordingly, it is an object of the present invention to provide a power generator which can efficiently generate electric power in a wide range of a bias magnetic field. Further, it is also an object of the present invention to provide a power generator whose degree of freedom for design is high.

Means for Solving the Problems

The above objects are achieved by the present inventions defined in the following (1) to (13).

(1) A power generator comprising:

a magnetostrictive rod through which lines of magnetic force pass in an axial direction thereof, the magnetostrictive rod formed of a magnetostrictive material;

a coil arranged so that the lines of magnetic force pass inside the coil in an axial direction of the coil whereby a voltage is generated in the coil due to variation of density of the lines of magnetic force; and a bias stress generating mechanism for generating compressive stress in the magnetostrictive rod in a natural state, wherein the magnetostrictive rod has one end portion and the other end portion, and wherein the power generator is configured to generate the voltage in the coil due to the variation of the density of the lines of magnetic force when the other end portion of the magnetostrictive rod is displaced with respect to the one end portion of the magnetostrictive rod in a direction substantially perpendicular to the axial direction of the magnetostrictive rod to expand and contract the magnetostrictive rod.

(2) The power generator according to the above (1), wherein the bias stress generating mechanism includes a beam member which is arranged along the magnetostrictive rod and allows the one end portion and the other end portion of the magnetostrictive rod to approach to each other to generate the compressive stress in the magnetostrictive rod.

(3) The power generator according to the above (2), wherein a gap between the beam member and the magnetostrictive rod on the side of the other end portion of the magnetostrictive rod is smaller than a gap between the beam member and the magnetostrictive rod on the side of the one end portion of the magnetostrictive rod in a side view.

(4) The power generator according to the above (2) or (3), wherein the beam member is formed of a non-magnetic material.

(5) The power generator according to any one of the above (2) to (4), wherein the magnetostrictive rod includes two or more of magnetostrictive rods arranged side by side, and wherein the two or more of magnetostrictive rods are arranged so as not to overlap with the beam member in a planar view.

(6) The power generator according to the above (5), wherein the beam member is arranged between the magnetostrictive rods in the planar view.

(7) The power generator according to any one of the above (1) to (6), wherein the bias stress generating mechanism includes an elastic member for generating the compressive stress in the magnetostrictive rod.

(8) The power generator according to the above (7), wherein the elastic member includes a coil spring for pushing or pulling the other end portion of the magnetostrictive rod in a displacement direction in which the magnetostrictive rod can be displaced to generate the compressive stress in the magnetostrictive rod.

(9) The power generator according to the above (7) or (8), wherein the elastic member includes a coil spring for pulling the magnetostrictive rod in a direction in which the one end portion and the other end portion of the magnetostrictive rod approach to each other.

(10) The power generator according to the above (7) or (8), wherein the elastic member includes a wire for pulling the magnetostrictive rod in a direction in which the one end portion and the other end portion of the magnetostrictive rod approach to each other.

(11) The power generator according to any one of the above (1) to (10), wherein the bias stress generating mechanism further includes a magnetic member provided on the side of the other end portion of the magnetostrictive rod and a magnet for attracting the magnetic member so as to generate the compressive stress in the magnetostrictive rod.

(12) The power generator according to any one of the above (1) to (11), further comprising:

a first block body including a receiving portion for receiving the one end portion of the magnetostrictive rod, the first block body formed of a magnetic material; and a second block body including a receiving portion for receiving the other end portion of the magnetostrictive rod, the second block body formed of a magnetic material.

(13) The power generator according to any one of the above (1) to (12), wherein the coil is wound around the magnetostrictive rod.

Effects of the Invention

According to the present invention, since the compressive stress (contraction stress) is generated in the magnetostrictive rod in the natural state (that is a state that external force is not applied to the power generator), the magnetic permeability of the magnetostrictive rod is lower than the case where the stress does not occur in the magnetostrictive rod. Thus, in this power generator, it is possible to increase the variation amount of the magnetic flux density caused by the generation of the tensile stress (stretching stress) in the magnetostrictive rod and sufficiently increase the variation amount of the magnetic flux density in the magnetostrictive rod when the tensile stress and the compressive stress are alternately generated in the magnetostrictive rod.

Further, generally, the variation amount of the magnetic flux density in the magnetostrictive rod increases until the intensity of the applied bias magnetic field reaches to a predetermined value (optimum value) and decreases as this intensity increases over the optimum value. According to the present invention, even in the case where the intensity of the bias magnetic field applied to the magnetostrictive rod is larger than the optimum value, it is possible to sufficiently increase the variation amount of the magnetic flux density in the magnetostrictive rod. Namely, it is possible to sufficiently increase the variation amount of the magnetic flux density in the magnetostrictive rod in a wide range of intensities of the bias magnetic field. As a result, it is possible to provide a power generator which can efficiently generate the electric power in a wide range of the bias magnetic field. Further, it is also possible to provide a power generator whose degree of freedom for design is high.

BRIEF DESCRIPTION OF THE DRAWINGS

Each of FIGS. 7(a) and 7(b) is a graph showing a relationship between magnetic flux density (B) and a bias magnetic field (H) applied to a magnetostrictive rod formed of a magnetostrictive material containing an iron-gallium based alloy as a main component thereof depending on stress generated in the magnetostrictive rod.

DETAILED DESCRIPTION OF THE PREFERRED EMBODIMENTS

Hereinafter, description will be given to a power generator of the present invention with reference to preferred embodiments shown in the accompanying drawings.

First Embodiment

First, description will be given to a first embodiment of the power generator of the present invention.

Figure 1:
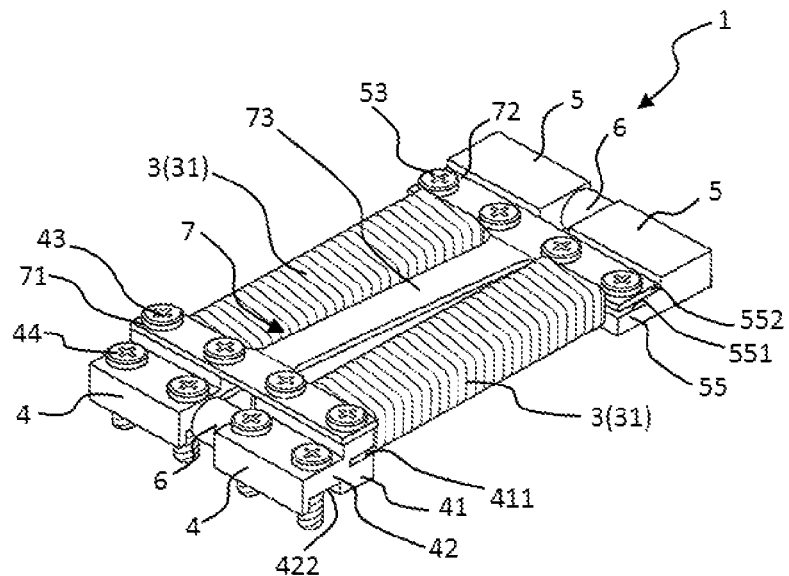
FIG. 1 is a perspective view showing a first embodiment of a power generator of the present invention.
Figure 2:
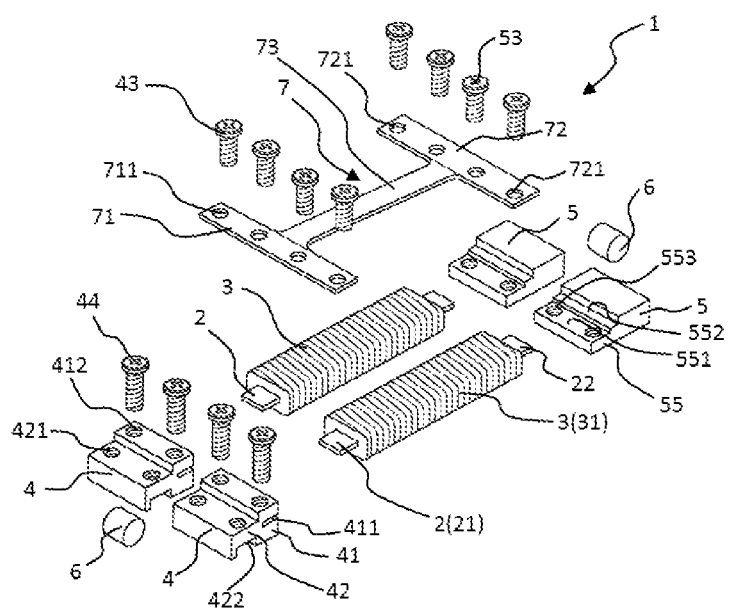
FIG. 2 is an exploded perspective view of the power generator shown in FIG. 1.
Figure 3:
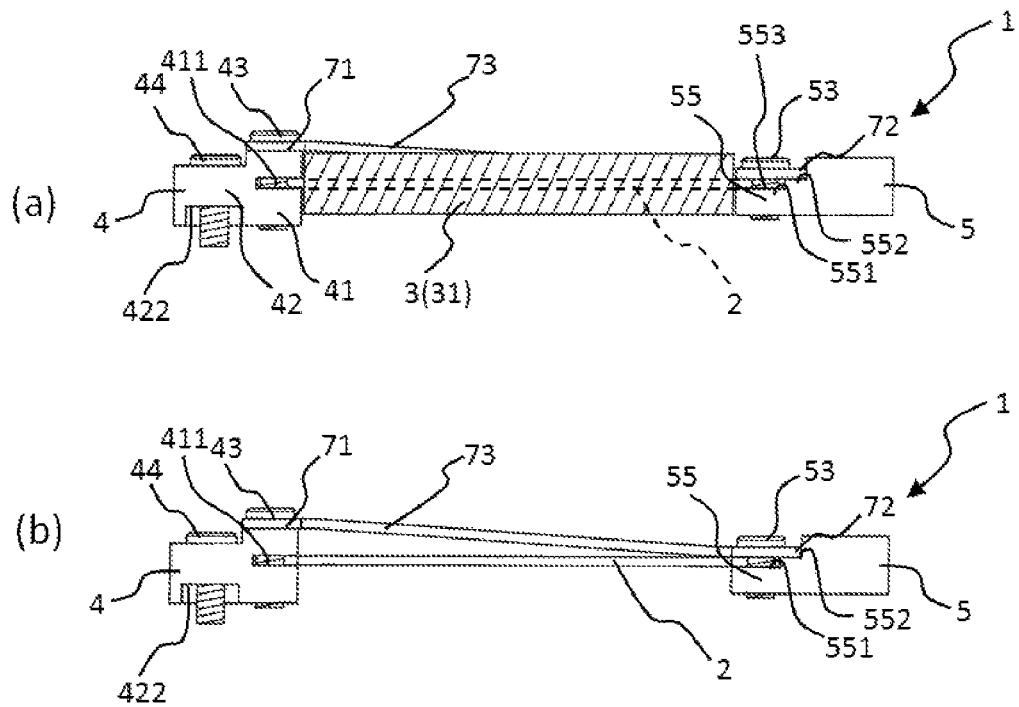
FIG. 3(a) is a right-side view of the power generator shown in FIG. 1.
FIG. 3(b) is a view showing a state that coils are removed from magnetostrictive rods shown in FIG. 3(a).
Figure 4:
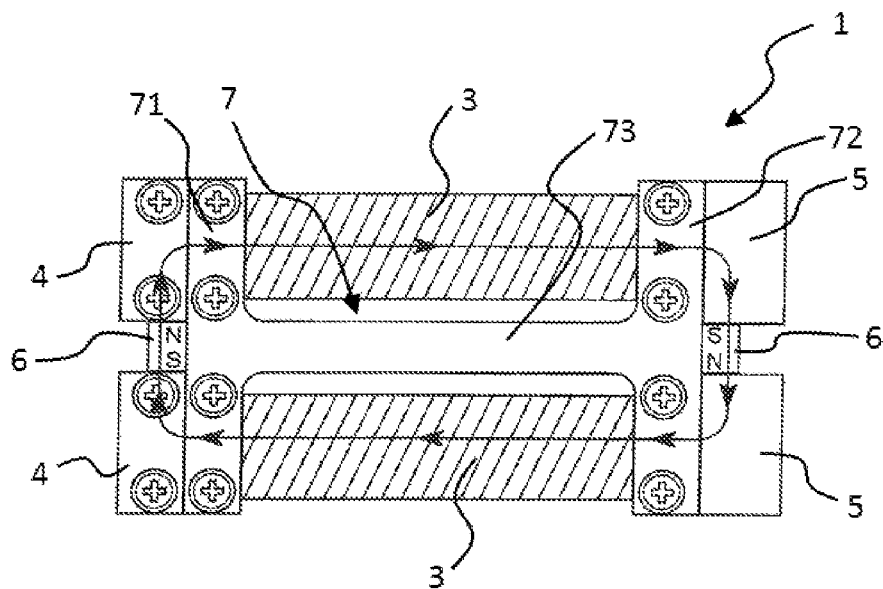
FIG. 4 is a planar view of the power generator shown in FIG. 1.
Figure 5:
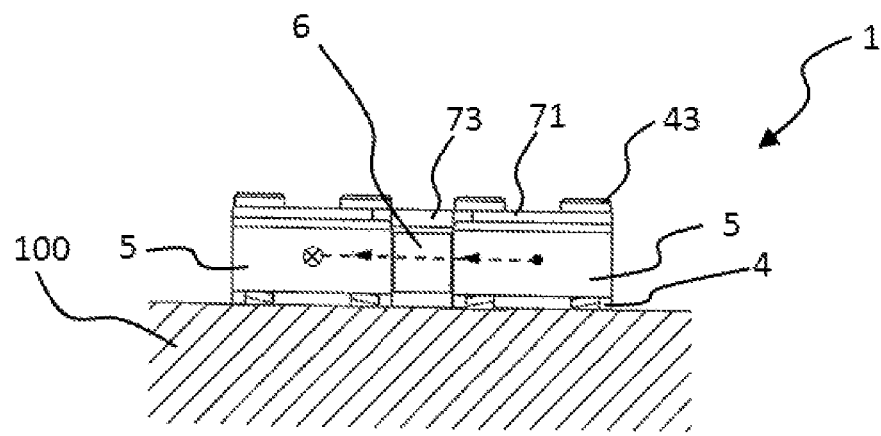
FIG. 5 is a front view of the power generator shown in FIG. 1.
Figure 6:
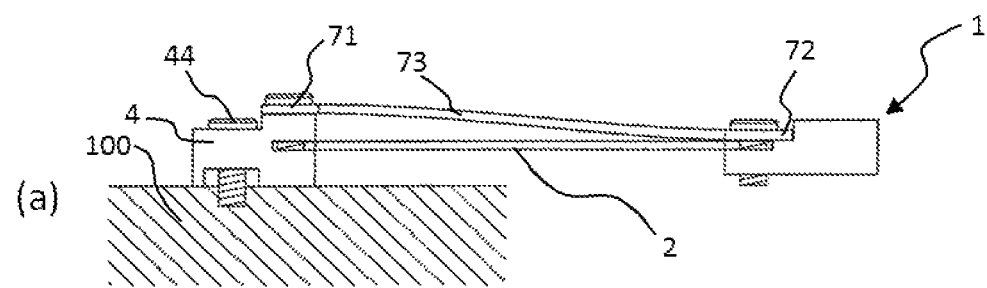
FIG. 6(a) is a side view showing a state that the power generator (with the coils being omitted) shown in FIG. 1 is attached to a vibrating body.
FIG. 6(b) is a view showing a state that external force is applied to a tip end portion of the power generator shown in FIG. 6(a) in the lower direction.
Figure 6:
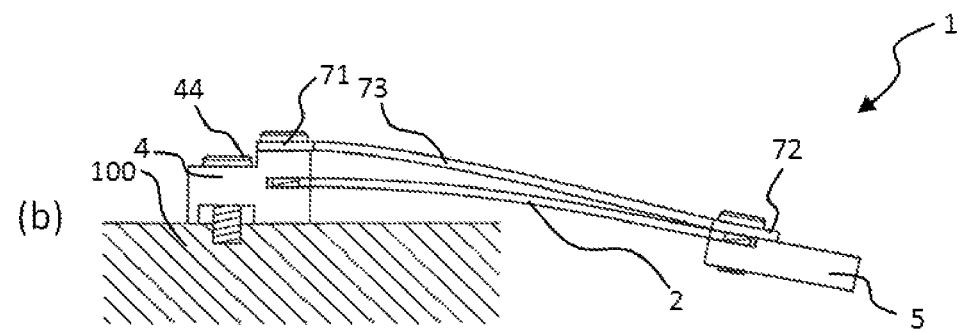

FIG. 1 is a perspective view showing the first embodiment of the power generator of the present invention. FIG. 2 is an exploded perspective view of the power generator shown in FIG. 1. FIG. 3($a$) is a right-side view of the power generator shown in FIG. 1. FIG. 3($b$) is a view showing a state that coils are removed from magnetostrictive rods shown in FIG. 3($a$). FIG. 4 is a planar view of the power generator shown in FIG. 1. FIG. 5 is a front view of the power generator shown in FIG. 1. FIG. 6($a$) is a side view showing a state that the power generator (with the coils being omitted) shown in FIG. 1 is attached to a vibrating body. FIG. 6($b$) is a view showing a state that external force is applied to a tip end portion of the power generator shown in FIG. 6($a$) in the lower direction.

Hereinafter, an upper side in each of FIGS. 1, 2, 3($a$), 3($b$), 5, 6($a$) and 6($b$) and a front side of the paper in FIG. 4 are referred to as "upper" or "upper side" and a lower side in each of FIGS. 1, 2, 3($a$), 3($b$), 5, 6($a$) and 6($b$) and a rear side of the paper in FIG. 4 are referred to as "lower" or "lower side". Further, a right and rear side of the paper in each of FIGS. 1 and 2 and a right side of each of FIGS. 3($a$), 3($b$), 4, 6($a$) and 6($b$) are referred to as "tip end side" and a left and front side of the paper in each of FIGS. 1 and 2 and a left side in each of FIGS. 3($a$), 3($b$), 4, 6($a$) and 6($b$) are referred to as "base end side".

A power generator 1 shown in FIGS. 1 and 2 includes two magnetostrictive rods 2 through which lines of magnetic force pass in an axial direction thereof, coils 3 arranged so that the lines of magnetic force pass inside the coils 3 in an axial direction of each of the coils 3, and a beam member 73 having a function of generating stress in each of the magnetostrictive rods 2. Each of the magnetostrictive rods 2 includes a base end portion (one end portion) 21 and a tip end portion (the other end portion) 22. In this power generator 1, the tip end portion 22 of each of the magnetostrictive rods 2 is displaced with respect to the base end portion 21 of each of the magnetostrictive rods 2 in a direction substantially perpendicular to an axial direction of each of the magnetostrictive rods 2 (the vertical direction in FIG. 1) to expand and contract each of the magnetostrictive rods 2. At this time, magnetic permeability of each of the magnetostrictive rods 2 varies due to an inverse magnetostrictive effect. This variation of the magnetic permeability of each magnetostrictive rod 2 leads to variation of density of the lines of magnetic force passing through the magnetostrictive rods 2 (density of the lines of magnetic force passing through the coils 3), thereby generating a voltage in the coils 3.

Hereinafter, description will be given to each component of the power generator 1.

(Magnetostrictive Rod 2)

As shown in FIGS. 1 and 2, the power generator 1 of this embodiment includes the two magnetostrictive rods 2 arranged side by side. Each of the magnetostrictive rods 2 is formed of a magnetostrictive material and arranged so that a direction in which magnetization is easily generated (an easy magnetization direction) coincides with the axial direction thereof. In this embodiment, each of the magnetostrictive rods 2 has an elongated plate-like shape so that the lines of magnetic force pass through each of the magnetostrictive rods 2 in the axial direction thereof.

A thickness (cross-sectional area) of each of the magnetostrictive rods 2 is substantially constant along the axial direction thereof. An average thickness of each of the magnetostrictive rods 2 is not particularly limited to a specific value, but is preferably in the range of about 0.3 to 10 mm, and more preferably in the range of about 0.5 to 5 mm. Further, an average value of the cross-sectional area of each of the magnetostrictive rods 2 is preferably in the range of about 0.2 to 200 mm$^2$, and more preferably in the range of about 0.5 to 50 mm$^2$. With such a configuration, it is possible to reliably pass the lines of magnetic force through the magnetostrictive rods 2 in the axial direction thereof.

A Young's modulus of the magnetostrictive material is preferably in the range of about 40 to 100 GPa, more preferably in the range of about 50 to 90 GPa, and even more preferably in the range of about 60 to 80 GPa. By forming the magnetostrictive rods 2 with the magnetostrictive material having the above Young's modulus, it is possible to expand and contract the magnetostrictive rods 2 more drastically. Since this allows the magnetic permeability of each of the magnetostrictive rods 2 to vary more drastically, it is possible to more improve power generation efficiency of the power generator 1 (the coils 3).

The magnetostrictive material having the above Young's modulus is not particularly limited to a specific kind. Examples of such a magnetostrictive material include an iron-gallium based alloy, an iron-cobalt based alloy, an iron-nickel based alloy and a combination of two or more of these materials. Among them, a magnetostrictive material containing an iron-gallium based alloy (having a Young's modulus of about 70 GPa) as a main component thereof is preferably used. A Young's modulus of the magnetostrictive material containing the iron-gallium based alloy as the main component thereof can be easily adjusted to fall within the above range.

Further, it is preferable that the magnetostrictive material described above contains at least one of rare-earth metals such as Y, Pr, Sm, Tb, Dy, Ho, Er and Tm. By using the magnetostrictive material containing at least one rare-earth metal mentioned above, it is possible to more increase the variation of the magnetic permeability of each of the magnetostrictive rods 2.

The coils 3 are respectively wound around outer peripheries of the magnetostrictive rods 2 (arranged on the outer peripheral sides of the magnetostrictive rods 2) so as to respectively surround a portion of each magnetostrictive rod 2 except for both end portions 21, 22 of the magnetostrictive rod 2.

(Coil 3)

Each of the coils 3 is formed by winding a wire 31 around each magnetostrictive rod 2. With such a configuration, the coils 3 are arranged so that the lines of magnetic force passing through the magnetostrictive rods 2 pass inside the coils 3 (inner cavities of the coils 3) in an axial direction of the coils 3 (in this embodiment, the axial direction of the coils 3 is equivalent to the axial direction of the magnetostrictive rods 2). Due to the variation of the magnetic permeability of each of the magnetostrictive rods 2, that is, due to the variation of the density of the lines of magnetic force (magnetic flux density) passing through the magnetostrictive rods 2, the voltage is generated in the coils 3.

In the power generator 1 of this embodiment, the magnetostrictive rods 2 are arranged side by side in not a thickness direction thereof but a width direction thereof. Thus, it is possible to make a gap between the magnetostrictive rods 2 larger at the time of designing the power generator 1. Therefore, it is possible to sufficiently ensure spaces for the coils 3 wound around the magnetostrictive rods 2, thereby increasing a winding number of each of the coils 3 even if a wire 31 having a relatively large cross-sectional area (diameter) is used for forming each of the coils 3. Since the wire 31 having a large diameter has a small resistance value (small load impedance), it is possible to allow electric current to flow in the coils 3 efficiently, thereby efficiently utilizing the voltage generated in the coils 3.

The voltage ε generated in the coils 3 can be expressed by the following formula (1) based on the variation of the magnetic flux density of each of the magnetostrictive rods 2.

$$\varepsilon = N \times \Delta B / \Delta T \tag{1}$$

(wherein "N" is the winding number of the wire 31, "ΔB" is a variation amount of the magnetic flux passing in the inner cavities of the coils 3 and "ΔT" is a variation amount of time.)

As is clear from the above formula (1), the voltage ε generated in each of the coils 3 is proportional to the winding number of the wire 31 and the variation amount of the magnetic flux density of each of the magnetostrictive rods 2 (ΔB/ΔT). Thus, it is possible to improve the power generation efficiency of the power generator 1 by increasing the winding number of the wire 31.

The wire 31 is not particularly limited to a specific type. Examples of the wire 31 include a wire obtained by covering a copper base line with an insulating layer, a wire obtained by covering a copper base line with an insulating layer to which an adhesive (fusion) function is imparted and a combination of two or more of these wires.

The winding number of the wire 31 is not particularly limited to a specific value, but is preferably in the range of about 1000 to 10000, and more preferably in the range of about 2000 to 9000. With such a configuration, it is possible to more increase the voltage generated in each of the coils 3.

Further, the cross-sectional area of the wire 31 is not particularly limited to a specific value, but is preferably in the range of about $5 \times 10^{-4}$ to 0.15 mm$^2$, and more preferably in the range of about $2 \times 10^{-3}$ to 0.08 mm$^2$. Since the wire 31 with such a cross-sectional area of the above range has a sufficiently small resistance value, it is possible to efficiently output the electric current flowing in each of the coils 3 to the outside with the generated voltage. As a result, it is possible to improve the power generation efficiency of the power generator 1.

A cross-sectional shape of the wire 31 may be any shape. Examples of the cross-sectional shape of the wire 31 include a polygonal shape such as a triangular shape, a square shape, a rectangular shape and a hexagonal shape; a circular shape and an elliptical shape.

Although this matter is not shown in the drawings, both end portions of the wire 31 of each of the coils 3 are connected to an electric circuit such as a wireless device (wireless communication device). With this configuration, it is possible to utilize the voltage (electric power) generated in the coils 3 for the electric circuit.

First block bodies 4 are provided on the base end side of each magnetostrictive rod 2.

(First Block Body 4)

The first block bodies 4 serve as a fixing portion for fixing the power generator 1 to a vibrating body generating vibration. By fixing the power generator 1 to the vibrating body through the first block bodies 4, each of the magnetostrictive rods 2 is supported in a cantilevered state that the base end portions 21 thereof serve as fixed end portions and the tip end portions 22 thereof serve as movable end portions. Examples of the vibrating body to which the first block bodies 4 are fixedly attached include a variety of vibrating bodies such as an air-conditioning duct. Concrete examples of the vibrating body will be described later.

As shown in FIGS. 1 and 2, each of the first block bodies 4 has a tall block body 41 provided on the tip end side and a short block body 42 shorter (thinner) than this tall block body 41. An external shape of each of the first block bodies 4 is a step-wise shape (multi-level shape).

A slit 411 is formed on a substantially central portion of the tall block body 41 in a thickness direction thereof along a width direction of the tall block body 41. The base end portion 21 of the magnetostrictive rod 2 is inserted (received) into this slit 411. Further, a pair of female screw portions 412 are formed in both end portions of the tall block body 41 in the width direction thereof so as to pass through the tall block body 41 in the thickness direction thereof. Male screws 43 are respectively screwed into the female screw portions 412.

A pair of female screw portions 421 are formed in both end portions of the short block body 42 in a width direction thereof so as to pass through the short block body 42 in a thickness direction thereof. Male screws 44 are respectively screwed into the female screw portions 421. By screwing these male screws 44 into a housing and the like through the female screw portions 421, it is possible to fix the first block bodies 4 to the housing.

Further, a groove 422 is formed on a lower surface of the short block body 42 so as to extend in the width direction of the short block body 42. Thus, since each of the first block bodies 4 is fixed to the vibrating body through two portions (that is a portion on the base end side (the short block body 42) and a portion on the tip end side (the tall block body 41) facing each other through the groove 422), each of the first block bodies 4 is configured so as to be easily deformed (bent) in the vicinity of the groove 422. Therefore, it is possible to efficiently transfer the vibration of the vibrating body to the tip end portions 22 of the magnetostrictive rods 2 (second block bodies 5) through the first block bodies 4. As a result, it is possible to efficiently generate the tensile stress (stretching stress) or the compressive stress (contraction stress) in the magnetostrictive rods 2.

On the other hand, the second block bodies 5 are provided on the tip end side of the magnetostrictive rods 2.

(Second Block Body 5)

Each of the second block bodies 5 serves as a weight for applying external force or vibration to the magnetostrictive rods 2. When the vibrating body vibrates, external force or vibration in the vertical direction is applied to the second block bodies 5. By applying the external force or the vibration to the second block bodies 5, the tip end portions 22 of the magnetostrictive rods 2 begin reciprocating motion in the vertical direction in the cantilevered state that the base end portions 21 of the magnetostrictive rods 2 serve as the fixed end portions and the tip end portions 22 of the magnetostrictive rods 2 serve as the movable end portions. Namely, the tip end portions 22 of the magnetostrictive rods 2 are relatively displaced with respect to the base end portions 21 of the magnetostrictive rods 2.

As shown in FIGS. 1 and 2, each of the second block bodies 5 has a substantially rectangular parallelepiped shape. A multi-level portion 55 is formed on each of the second block bodies 5 so as to be a step-wise shape (multi-level shape) having steps whose step on the base end side is lower than a step on the tip end side by two levels. The multi-level portion 55 has a first level surface 551 which is provided on the base end side and on which the tip end portion 22 of the magnetostrictive rod 2 is to be placed (received) and a second level surface 552 provided on the tip end side of the first level surface 551 and being higher than the first level surface 551 by one level. In this regard, a height from the second level surface 522 to the first level surface 551 of the second block body 5 is set so as to be substantially equal to a thickness of the tip end portion 22 of the magnetostrictive rod 2.

Further, a pair of female screw portions 553 are formed in the vicinities of both end portions of the first level surface 551 of the multi-level portion 55 in a width direction thereof so as to pass through the multi-level portion 55 in a thickness direction thereof. The pair of female screw portions 553 are configured to be screwed with two male screws 53, respectively.

A constituent material for each of the first block bodies 4 and the second block bodies 5 is not particularly limited to a specific kind as long as it has an enough stiffness for reliably fixing the end portions 21, 22 of the magnetostrictive rods 2 to each block body 4, 5 and generating uniform stress in the magnetostrictive rods 2 and enough ferromagnetism for applying a bias magnetic field generated from two permanent magnets 6 to the magnetostrictive rods 2. Examples of the constituent material having the above properties include a pure iron (e.g., "JIS SUY"), a soft iron, a carbon steel, a magnetic steel (silicon steel), a high-speed tool steel, a structural steel (e.g., "JIS SS400"), a stainless, a permalloy and a combination of two or more of these materials.

A width of each of the first block bodies 4 and the second block bodies 5 is designed so as to be larger than a width of the magnetostrictive rod 2. Specifically, each of the first block bodies 4 and the second block bodies 5 has a width which enables the magnetostrictive rods 2 to be arranged between the pairs of female screw portions 412, 553 when the base end portions 21 of the magnetostrictive rods 2 are inserted into the slits 411 of the first block bodies 4 and the tip end portions 22 of the magnetostrictive rods 2 are placed on the first level surfaces 551 of the second block bodies 5. The width of each block body 4, 5 as described above is preferably in the range of about 3 to 15 mm, and more preferably in the range of about 5 to 10 mm. By setting the width of each block body 4, 5 to fall within the above range, it is possible to downsize the power generator 1 and sufficiently ensure a size of each of the coils 3 respectively wound around the magnetostrictive rods 2.

The two permanent magnets 6 for applying the bias magnetic field to the magnetostrictive rods 2 are respectively provided between the first block bodies 4 and between the second block bodies 5.

(Permanent Magnet 6)

Each of the permanent magnets 6 has a columnar shape.

As shown in FIG. 4, the permanent magnet 6 provided between the first block bodies 4 is arranged so that its south pole is directed toward the lower side in FIG. 4 and its north pole is directed toward the upper side in FIG. 4. Further, the permanent magnet 6 provided between the second block bodies 5 is arranged so that its south pole is directed toward the upper side in FIG. 4 and its north pole is directed toward the lower side in FIG. 4. Namely, each of the permanent magnets 6 is arranged so that a magnetization direction of each of the permanent magnets 6 coincides with an arrangement direction of the magnetostrictive rods 2 (see FIG. 5). With this configuration, a magnetic field loop circulating in the clockwise direction is formed in the power generator 1.

As the permanent magnet 6, it is possible to use an alnico magnet, a ferrite magnet, a neodymium magnet, a samarium-cobalt magnet, a magnet (a bonded magnet) obtained by molding a composite material prepared by pulverizing and mixing at least one of these magnets with a resin material or a rubber material, or the like. In order to more fixedly attach the permanent magnets 6 to each block body 4, 5, it is preferable to use a method for bonding the permanent magnets 6 to each block body 4, 5 with an adhesive agent or the like.

In the power generator 1, the permanent magnet 6 provided between the second block bodies 5 is configured to be displaced together with the second block bodies 5. Thus, friction does not occur between the second block bodies 5 and the permanent magnet 6. Since energy for displacing the second block bodies 5 is not consumed by this friction in the power generator 1, the power generator 1 can efficiently generate the electric power.

The magnetostrictive rods 2 as described above are connected with each other by a connecting portion 7 through the first block bodies 4 and the second block bodies 5.

(Connecting Portion 7)

The connecting portion 7 includes a first connecting member 71 for connecting the first block bodies 4 with each other, a second connecting member 72 for connecting the second block bodies 5 with each other and one beam member 73 for connecting the first connecting member 71 and the second connecting member 72.

In this embodiment, each of the first connecting member 71, the second connecting member 72 and the beam member 73 has a belt-like shape (elongated plate-like shape). The connecting portion 7 has an H-like shape in a planar view as a whole. Although the connecting portion 7 may take a configuration in which the members are connected with each other with a welding method or the like, it is preferable that the connecting portion 7 takes a configuration in which the members are formed integrally with each other.

The first connecting member 71 is configured to make contact with an upper surface of the tall block body 41 of each of the first block bodies 4. The second connecting member 72 is configured so that a part of the second connecting member 72 makes contact with the second level surface 552 of each of the second block bodies 5.

As shown in FIGS. 3(a) and 3(b), the power generator 1 of this embodiment is configured so that a height from the upper surface to the lower surface of the tall block body 41 of the first block body 4 (a thickness of the first block body 4 at the tall block body 41) is higher than a height from a lower surface to an upper surface of the second level surface 552 of the second block body 5 (a thickness of the second block body 5 at the second level surface 552) in a side view. Thus, the power generator 1 of this embodiment is configured so that a separation distance between the magnetostrictive rod 2 and the first connecting member 71 is longer than a separation distance between the magnetostrictive rod 2 and the second connecting member 72. With this configuration, a gap between the magnetostrictive rod 2 and the beam member 73 connecting the first connecting member 71 and the second connecting member 72 decreases from the base end side toward the tip end side in the side view.

For example, the connecting portion 7 having such a configuration can be obtained by preparing a plate material having an H-shaped in a planar view thereof and then bending the plate material with a press work, a bending work, a hammering work or the like so that the first connecting member 71 and the second connecting member 72 are bent from the beam member 73 respectively in two directions opposite to each other. By using such a method for obtaining the connecting portion 7, it is possible to easily and arbitrarily adjust an angle formed by the first connecting member 71 and the beam member 73 and an angle formed by the second connecting member 72 and the beam member 73.

The first connecting member 71 includes four through-holes 711 formed at four positions respectively corresponding to the four female screw portions 412 formed in the two first block bodies 4. The base end portions 21 of the magnetostrictive rods 2 are inserted into the slits 411 and the male screws 43 are screwed with the female screw portions 412 passing through the through-holes 711 of the first connecting member 71. With this configuration, the base end portions 21 (the magnetostrictive rods 2) are fixed to the first block bodies 4 when the first connecting member 71 is screw-fixed to each of the tall block bodies 41 (the first block bodies 4) to narrow spaces in the slits 411.

The second connecting member 72 includes four through-holes 721 formed at four positions respectively corresponding to the four female screw portions 553 formed in the two second block bodies 5. The male screws 53 are screwed with the female screw portions 553 passing through the through-holes 711 in a state that the tip end portions 22 of the magnetostrictive rods 2 are placed on the first level surfaces 551 of the second block bodies 5 and a base end portion of the second connecting member 72 makes contact with the second level surfaces 552 of the second block bodies 5. With this configuration, the second connecting member 72 is screw-fixed to the second block bodies 5 and the tip end portions 22 are gripped between a lower surface of the second connecting member 72 and the first level surfaces 551 of the second block bodies 5. Thus, the tip end portions 22 (the magnetostrictive rods 2) are fixed to the second block bodies 5.

As described above, the magnetostrictive rods 2 and the first connecting member 71 are fastened to the first block bodies 4 with the male screws 43, and the magnetostrictive rods 2 and the second connecting member 72 are fastened to the second block bodies 5 with the male screws 53. Thus, it is possible to reduce the number of parts and the number of steps for fixing and connecting the members with each other. In this regard, a fixing and connecting method is not limited to the above screwing method. Examples of the fixing and connecting method include a caulking method, a diffusion bonding method, a pin pressure fitting method, a brazing method, a welding method (such as a laser welding method and an electric welding method) and a bonding method with an adhesive agent.

By adjusting lengths of the first connecting member 71 and the second connecting member 72, it is possible to change the gap between the magnetostrictive rods 2. By enlarging the gap between the magnetostrictive rods 2, it is possible to sufficiently ensure spaces for respectively winding the coils 3 around the magnetostrictive rods 2. With this configuration, it is possible to sufficiently enlarge the sizes of the coils 3, thereby improving the power generation efficiency of the power generator 1.

The beam member 73 connects a central portion of the first connecting member 71 and a central portion of the second connecting member 72. In the power generator 1, this beam member 73 and the magnetostrictive rods 2 are arranged so as not to overlap with each other in the planar view (see FIG. 1) and configured so that the gap between the beam member 73 and the magnetostrictive rods 2 decreases from the base end side to the tip end side in the side view (see FIG. 3). In this embodiment, a width of the beam member 73 is set so as to be smaller than a gap between the coils 3 respectively wound around the magnetostrictive rods 2. Further, the beam member 73 is configured to overlap with the coils 3 on the tip end side in the side view.

In the power generator 1, the magnetostrictive rods 2 and the beam member 73 serve as beams facing each other. The magnetostrictive rods 2 and the beam member 73 are displaced in the same direction (the upper direction or the lower direction in FIG. 1) together when the second block bodies 5 are displaced. At this time, stress is generated in each of the magnetostrictive rods 2 due to the beam member 73. At this time, since the beam member 73 is arranged between the coils 3 respectively wound around the magnetostrictive rods 2, each of the magnetostrictive rods 2 does not make contact with the beam member 73 when each of the magnetostrictive rods 2 is displaced.

Further, the connecting portion 7 is configured so that a length of the beam member 73 before the connecting portion 7 is connected to the first block bodies 4 and the second block bodies 5 is longer than a length from tip end portions of the first block bodies 4 to base end portions of the second block bodies 5 connected to the magnetostrictive rods 2 in the planar view. In this embodiment, the first block bodies 4 and the second block bodies 5 are connected with each other by the connecting portion 7 having the beam member 73 as described above. Thus, in the power generator 1, the second block bodies 5 are pressed toward the lower direction (the right and lower direction in FIG. 3(b)) by the beam member 73 to displace the second block bodies 5 with respect to the first block bodies 4. With this configuration, the base end portions 21 and the tip end portions 22 of the magnetostrictive rods 2 approach to each other in a natural state (that is a state that external force is not applied to the power generator 1) (see FIG. 3(b)). As a result, compressive stress is generated in each of the magnetostrictive rods 2. In this embodiment, the beam member 73 described above constitutes a bias stress generating mechanism for generating bias stress (the compressive stress) in the magnetostrictive rods 2 in the natural state.

The power generator 1 as described above is used in a state that the first block bodies 4 are fixed to a housing 100 of the vibrating body through the male screws 44 (see FIG. 6(a)). In this state, when the second block bodies 5 are displaced (pivotally moved) with respect to the first block bodies 4 in the lower direction by the vibration of the vibrating body (see FIG. 6(*b*)), that is when the tip end portions 22 of the magnetostrictive rods 2 are displaced with respect to the base end portions 21 of the magnetostrictive rods 2 in the lower direction, the beam member 73 is deformed so as to be expanded in an axial direction thereof and the magnetostrictive rods 2 are deformed so as to be contracted in the axial direction thereof. On the other hand, when the second block bodies 5 are displaced (pivotally moved) in the upper direction, that is when the tip end portions 22 of the magnetostrictive rods 2 are displaced with respect to the base end portions 21 of the magnetostrictive rods 2 in the upper direction, the beam member 73 is deformed so as to be contracted in the axial direction thereof and the magnetostrictive rods 2 are deformed so as to be expanded in the axial direction thereof. As a result, the magnetic permeability of each of the magnetostrictive rods 2 varies due to the inverse magnetostrictive effect. This variation of the magnetic permeability of each of the magnetostrictive rods 2 leads to the variation of the density of the lines of magnetic force passing through the magnetostrictive rods 2 (the density of the lines of magnetic force passing through the coils 3), thereby generating the voltage in the coils 3.

In the power generator 1 described above, a magnitude of the voltage (a power generation amount) generated in the coils 3 is proportional to the variation amount of the magnetic flux density of each of the magnetostrictive rods 2. The variation amount of the magnetic flux density of each of the magnetostrictive rods 2 depends on an intensity of the applied bias magnetic field and a magnitude of the stress (the tensile stress or the compressive stress) generated in each of the magnetostrictive rods 2.

Figure 7:
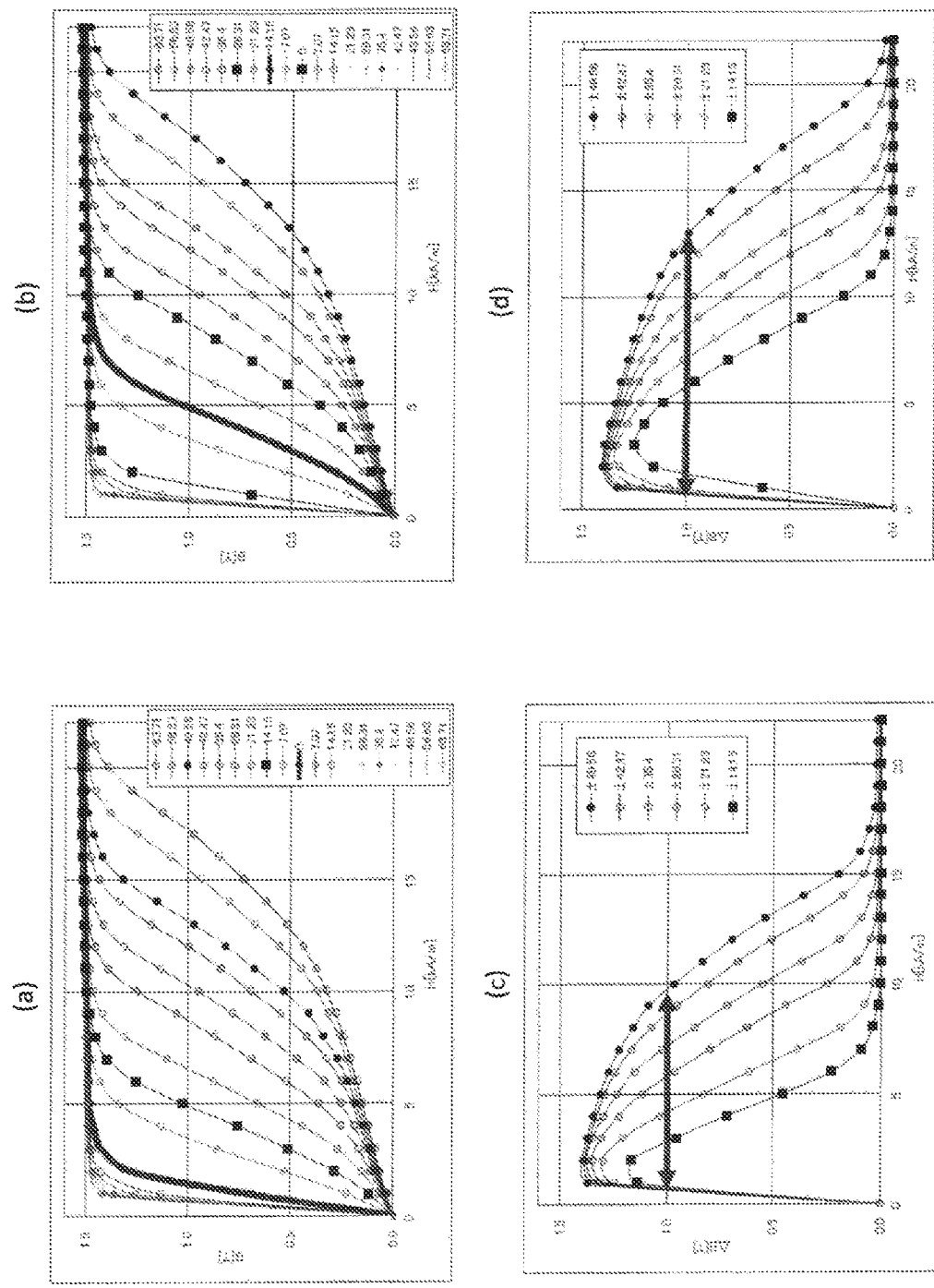
FIG. 7(c) is a graph showing a relationship between a variation amount of the magnetic flux density ($\Delta$B) and the bias magnetic field (H) applied to the magnetostrictive rod depending on the stress generated in the magnetostrictive rod. In this graph, a state in that the stress does not occur in the magnetostrictive rod is utilized as a reference.
FIG. 7(d) is a graph showing the relationship between the variation amount of the magnetic flux density ($\Delta$B) and the bias magnetic field (H) applied to the magnetostrictive rod depending on the stress generated in the magnetostrictive rod. In this graph, a state that compressive stress of 14.15 MPa occurs in the magnetostrictive rod is utilized as a reference.

FIG. 7 is graphs showing a relationship between magnetic flux density (B) and a bias magnetic field (H) applied to the magnetostrictive rod formed of the magnetostrictive material containing the iron-gallium based alloy (having the Young's modulus of about 70 GPa) as the main component thereof depending on the stress generated in the magnetostrictive rod and a relationship between a variation amount of the magnetic flux density (ΔB) and the applied bias magnetic field (H), as concrete examples.

Specifically, each of FIGS. 7(*a*) and 7(*b*) is a graph showing the relationship between the magnetic flux density (B) and the bias magnetic field (H) applied to the magnetostrictive rod depending on the stress generated in the magnetostrictive rod. FIG. 7(*c*) is a graph showing the relationship between the variation amount of the magnetic flux density (ΔB) and the bias magnetic field (H) applied to the magnetostrictive rod depending on the stress generated in the magnetostrictive rod. In this graph, a state in that the stress does not occur in the magnetostrictive rod is utilized as a reference. FIG. 7(*d*) is a graph showing the relationship between the variation amount of the magnetic flux density (ΔB) and the bias magnetic field (H) applied to the magnetostrictive rod depending on the stress generated in the magnetostrictive rod. In this graph, a state that compressive stress of 14.15 MPa occurs in the magnetostrictive rod is utilized as a reference.

In this regard, the relationship (H-B curve) between the magnetic flux density (B) and the bias magnetic field (H) in a state that the stress (±0 MPa) does not occur in the magnetostrictive rod is represented by a heavy line in FIG. 7(*a*). Further, the relationship (H-B curve) between the magnetic flux density (B) and the bias magnetic field (H) in a state that the compressive stress of 14.15 MPa (−14.15 MPa) occurs in the magnetostrictive rod is represented by a heavy line in FIG. 7(*b*). In the following description, for example, the language of "the stress of ±14.15 MPa is generated" in the magnetostrictive rod in which the bias stress is not generated in the natural state means a situation that the tensile stress of 14.15 MPa (+14.15 MPa) and the compressive stress of 14.15 MPa (−14.15 MPa) are alternately generated in the magnetostrictive rod.

As shown in FIG. 7(*a*), the magnetic permeability of the magnetostrictive rod in which the tensile stress occurs is higher than the magnetic permeability of the magnetostrictive rod in which the stress does not occur. In addition, this tendency becomes remarkable as the tensile stress generated in the magnetostrictive rod increases. As a result, the density of the lines of magnetic force (the magnetic flux density) passing through the magnetostrictive rod in the axial direction thereof becomes higher as the tensile stress generated in the magnetostrictive rod increases (see H-B curves positioned on the upper side of the heavy line in FIG. 7(*a*)). On the other hand, the magnetic permeability of the magnetostrictive rod in which the compressive stress occurs is lower than the magnetic permeability of the magnetostrictive rod in which the stress does not occur. This tendency becomes remarkable as the compressive stress generated in the magnetostrictive rod increases. As a result, the density of the lines of magnetic force (the magnetic flux density) passing through the magnetostrictive rod in the axial direction thereof becomes lower as the compressive stress generated in the magnetostrictive rod increases (see H-B curves positioned on the lower side of the heavy line in FIG. 7(*a*)).

As shown in FIG. 7(*a*), in the magnetostrictive rod as described above, the variation amount of the magnetic flux density (magnetic permeability) caused by the generation of the compressive stress is large. Namely, the decreasing amount of the magnetic flux density of the magnetostrictive rod from a state that the stress does not occur in the magnetostrictive rod is large. On the other hand, the variation amount of the magnetic flux density (magnetic permeability) caused by the generation of the tensile stress is small. Namely, the increasing amount of the magnetic flux density of the magnetostrictive rod from a state that the stress does not occur in the magnetostrictive rod is small.

Thus, even if the tensile stress and the compressive stress having a certain magnitude are alternately generated in the magnetostrictive rod in which the bias stress is not generated in the natural state, the variation amount of the magnetic flux density caused by this tensile stress is small. Therefore, depending on the intensity of the applied bias magnetic field, it is difficult to sufficiently vary the magnetic flux density of the magnetostrictive rod.

For example, as shown in FIG. 7(*c*), when the stress of ±14.15 MPa is generated in the magnetostrictive rod in which the bias stress is not generated in the natural state, the intensity of the bias magnetic field required for obtaining the variation amount of the magnetic flux density (ΔB) equal to or more than 1 T is about 0.8 to 2.8 kA/m. Further, when the stress of ±49.56 MPa is generated in such a magnetostrictive rod, the intensity of the bias magnetic field required for obtaining the variation amount of magnetic flux density (ΔB) equal to or more than 1 T is about 0.8 to 9.8 kA/m.

In contrast, in the power generator 1, since the compressive stress is generated in each of the magnetostrictive rods 2 in the natural state, the magnetic permeability of each of the magnetostrictive rods 2 in the natural state is lower than the magnetic permeability of the magnetostrictive rod in which the stress does not occur. Each of the magnetostrictive rods 2 is expanded and contracted from a basic state that the compressive stress is generated in each of the magnetostrictive rods 2.

For example, as shown in FIG. 7(b), when the compressive stress of 14.15 MPa is generated in each of the magnetostrictive rods 2 in the natural state, each of the magnetostrictive rods 2 is expanded and contracted from a basic state represented by the heavy line in FIG. 7(b). In this case, the variation amount (increasing amount) of the magnetic flux density caused by the generation of the tensile stress is larger than the variation amount of the magnetic flux density when the tensile stress is generated in the magnetostrictive rod in which the bias stress is not generated in the natural state.

Thus, in the magnetostrictive rods 2 of the power generator 1, it is possible to increase the variation amount of the magnetic flux density caused by the generation of the compressive stress and the variation amount of the magnetic flux density caused by the generation of the tensile stress. With this configuration, it is possible to broaden a range of intensities of the bias magnetic field required for obtaining the sufficient variation amount of the magnetic flux density (equal to or more than 1 T).

For example, as shown in FIG. 7(d), the stress of ±14.15 MPa is generated in the magnetostrictive rod in which the compressive stress of 14.15 MPa is generated in the natural state. Namely, the tensile stress and the compressive stress alternately generated in the magnetostrictive rod are set to be respectively 0 MPa and −28.3 MPa. At this time, the intensity of the bias magnetic field required for obtaining the variation amount of the magnetic flux density (ΔB) equal to or more than 1 T is about 1.6 to 5.7 kA/m. Further, the stress of ±49.56 MPa is generated in such a magnetostrictive rod. Namely, the tensile stress and the compressive stress alternately generated in the magnetostrictive rod are set to be respectively +35.4 MPa and −63.71 MPa. At this time, the intensity of the bias magnetic field required for obtaining the variation amount of the magnetic flux density (ΔB) equal to or more than 1 T is about 0.7 to 13 kA/m.

The comparison of FIGS. 7(c) and 7(d) indicates that the range of intensities of the bias magnetic field required for obtaining the sufficient variation amount of the magnetic flux density can be broadened by generating the compressive stress (the bias stress) in the magnetostrictive rod in the natural state.

As described above, in the power generator 1, the range of intensities of the bias magnetic field required for generating the sufficient variation amount of the magnetic flux density in each of the magnetostrictive rods 2 is broadened. Thus, for example, it is possible to generate the variation of the magnetic flux density in each of the magnetostrictive rods 2 in the same manner even if a different magnet having a different size or a different shape is used as the permanent magnet 6 or a different magnet having different characteristics such as attracting force or a maximum energy product is used as the permanent magnet 6. Further, even if the positional relationship between the magnetostrictive rods 2 and the permanent magnets 6 is changed and the intensity of the bias magnetic field applied to the magnetostrictive rods 2 is changed, it is possible to generate the sufficient variation of the magnetic flux density in each of the magnetostrictive rods 2. As described above, in the power generator 1, it is possible to sufficiently increase the variation amount of the magnetic flux density of each of the magnetostrictive rods 2 even if the configuration (the size, the position or the like of each component) of the power generator 1 is changed with a certain level of freedom for design. Namely, it is possible to increase a degree of freedom for designing the power generator 1. Further, the power generator 1 can obtain a large power generation amount in a wide range of intensities of the bias magnetic field. Thus, even if variation in the intensity of the bias magnetic field applied to the magnetostrictive rods 2 is caused by an assembly error generated by errors of material characteristics of the components constituting the power generator 1, shape tolerance of the components, positional shifts of attachment positions of the components at the time of assembling the power generator 1 or the like, the power generator 1 can stably obtain the sufficient large power generation amount.

Further, in the power generator 1, each of the magnetostrictive rods 2 is expanded and contracted from the basic state that the compressive stress is generated in each of the magnetostrictive rods 2. When the same external force is applied to the magnetostrictive rods 2 and the magnetostrictive rod in which the stress is not generated in the natural state, the magnitude of the compressive stress generated in each of the magnetostrictive rods 2 is smaller than the magnitude of the compressive stress generated in the magnetostrictive rod (which is expanded and contracted from a basic state that the stress is not generated in the magnetostrictive rod in the natural state). Generally, when the tensile stress is repeatedly generated in one member, the member is likely to be deteriorated and its durability also deteriorates. On the other hand, since the compressive stress is generated in each of the magnetostrictive rods 2 of the power generator 1 in the natural state, it is possible to prevent the magnetostrictive rods 2 from being deteriorated and keep their superior durability even if the power generator 1 is repeatedly used.

In particular, selectable kinds of the described constituent material for the magnetostrictive rods 2 are limited and the constituent material for the magnetostrictive rods 2 has relatively low stiffness. In the power generator 1, by using a material having relatively high stiffness as described below as the constituent material for the beam member 73 serving as the parallel beams in cooperation with the magnetostrictive rods 2, it is possible to improve durability of the magnetostrictive rods 2 and the beam member 73 (connecting portion 7) and extend a product lifetime of the power generator 1.

Further, as described above, the power generator 1 is configured so that the gap between the magnetostrictive rods 2 and the beam member 73 (hereinafter, this gap is referred to as "beam gap") decreases from the base end side to the tip end side in the side view. In other words, the magnetostrictive rods 2 and the beam member 73 form a beam structure (tapered beam structure) tapering from the base end side to the tip end side (see FIG. 3(b)). In such a structure, stiffness of a pair of beams constituted of the magnetostrictive rods 2 and the beam member 73 in a displacement direction (the vertical direction) thereof decreases from the base end side to the tip end side. Thus, when the external force is applied to the tip end portion of the power generator 1 (the second block bodies 5), the magnetostrictive rods 2 and the beam member 73 can be smoothly displaced in the vertical direction. As a result, it is possible to reduce variation in the stress generated in each of the magnetostrictive rods 2 in the thickness direction thereof, thereby generating uniform stress in each of the magnetostrictive rods 2.

As described above, according to the power generator 1, it is possible to sufficiently increase the variation amount of the magnetic flux density of each of the magnetostrictive rods 2 in the wide range of intensities of the bias magnetic field even if the tensile stress and the compressive stress generated in each of the magnetostrictive rods 2 are relatively small. In addition, since it is possible to reduce the variation in the stress generated in each of the magnetostrictive rods 2 and generate the uniform stress in each of the magnetostrictive rods 2, the power generator 1 can efficiently generate the electric power by utilizing the applied external force.

Further, according to the power generator 1, it is possible to freely design the beam gap between the magnetostrictive rods 2 and the beam member 73. Specifically, by adjusting a length (height) from the slit 411 formed on each of the first block bodies 4 to the upper surface of each of the first block bodies 4 (the upper surface of the tall block body 41), it is possible to freely design the beam gap between the magnetostrictive rods 2 and the beam member 73 on the base end side. Thus, it is possible to freely design the beam gap between the magnetostrictive rods 2 and the beam member 73.

A relationship between the beam gap between the pair of beams and the stress generated when the external force is applied to tip end portions of the pair of beams has been analyzed by the inventors of the present invention. Further, from the following results of study, it has been found that substantially uniform stress is generated in each beam when the beam gap decreases.

Figure 8:
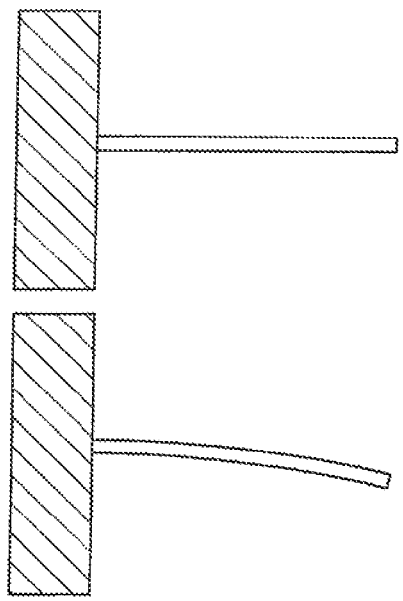
FIG. 8 is a side view schematically showing a state that external force in the lower direction is applied to a tip end portion of one rod member (one beam) whose base end portion is fixed to a housing.
Figure 9:
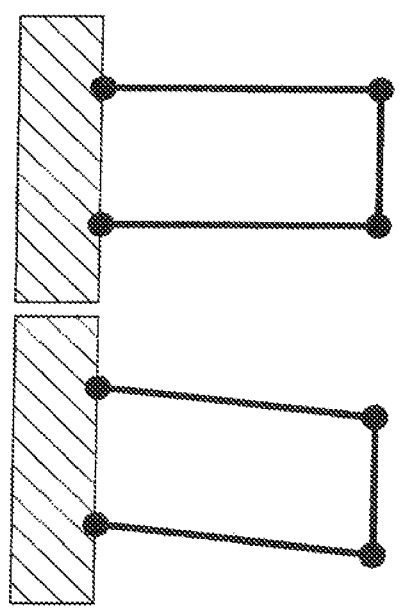
FIG. 9 is a side view schematically showing a state that external force in the lower direction is applied to tip end portions of a pair of beams (parallel beams) parallel arranged so as to face each other whose base end portions are fixed to the housing.
Figure 10:
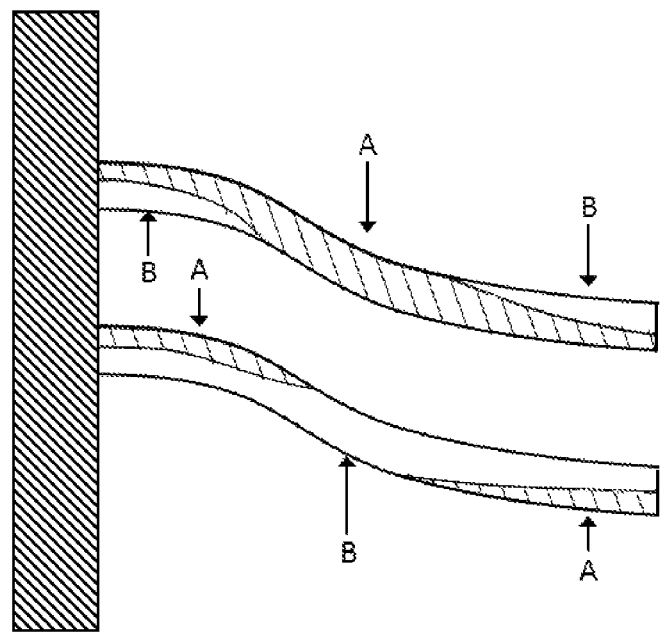
FIG. 10 is a view schematically showing stress (tensile stress and compressive stress) generated in the pair of parallel beams when the external force is applied to the tip end portions of the pair of parallel beams.

FIG. 8 is a side view schematically showing a state that external force in the lower direction is applied to a tip end portion of one rod member (one beam) whose base end portion is fixed to a housing. FIG. 9 is a side view schematically showing a state that external force in the lower direction is applied to the tip end portions of the pair of beams (parallel beams) parallel arranged so as to face each other whose base end portions are fixed to the housing. FIG. 10 is a view schematically showing the stress (the tensile stress and the compressive stress) generated in the pair of parallel beams when the external force is applied to the tip end portions of the pair of parallel beams.

Hereinafter, an upper side in each of FIGS. 8 to 10 is referred to as "upper" or "upper side" and a lower side in each of FIGS. 8 to 10 is referred to as "lower" or "lower side". Further, a left side in each of FIGS. 8 to 10 is referred to as "base end side" and a right side in each of FIGS. 8 to 10 is referred to as "tip end side".

When the external force is applied to the tip end portion of one beam so that the beam is bent and deformed in the lower direction as shown in FIG. 8, the stress is generated in the beam due to this bending deformation of the beam. At this time, uniform tensile stress (stretching stress) is generated on an upper portion of the beam and uniform compressive stress (contraction stress) is generated on a lower portion of the beam. On the other hand, when the external force is applied to the tip end portions of the parallel beams having a certain beam gap, the pair of beams are deformed with two states simultaneously occurring. One of the two states is that each beam is bent and deformed as shown in FIG. 8. The other one of the two states is that the pair of beams are deformed as shown in FIG. 9 so as to perform a parallel link movement for keeping the beam gap on the tip end side constant before and after the external force is applied. In the parallel beams, this parallel link operation becomes marked as the beam gap increases. On the other hand, the parallel link operation is suppressed as the beam gap decreases. Thus, the deformations of the parallel beams become similar to the bending deformation of the one beam as shown in FIG. 8 as the beam gap decreases.

Thus, the bending deformation as shown in FIG. 8 and the deformations due to the parallel link movement as shown in FIG. 9 simultaneously occur in the configuration of the parallel beams having a relatively large beam gap. As a result, each beam is deformed in a substantially S-like shape as shown in FIG. 10. When the parallel beams are deformed in the lower direction, it is preferable that uniform tensile stress is generated in the upper beam. Actually, as shown in FIG. 10, although tensile stress A is generated in a central portion of the upper beam, large compressive stress B is generated in a lower portion of the upper beam on the base end side and an upper portion of the upper beam on the tip end side. Further, it is preferable that uniform compressive stress is generated in the lower beam. Actually, although the compressive stress B is generated in a central portion of the lower beam, the large tensile stress A is generated in an upper portion of the lower beam on the base end side and a lower portion of the lower beam on the tip end side. Namely, since both of the tensile stress A and the compressive stress B generated in each beam are large, it is impossible to increase an absolute value of one of the tensile stress and the compressive stress generated in an entire of the beam. Thus, in the case of using the described parallel beams as the magnetostrictive rods, it is impossible to increase the variation amount of the magnetic flux density in each of the magnetostrictive rods.

From the above results of study, the following fact has been found. Namely, from a point of view of improving the power generation efficiency, it is preferable that the power generator whose magnetostrictive rods and beam member constitute the pair of parallel beams are configured so that a behavior of a bending deformation of the pair of parallel beams becomes similar to a behavior of the bending deformation of one beam as shown in FIG. 8 by decreasing the beam gap between the magnetostrictive rods and the beam member to suppress the parallel link movement of the beams.

Further, in the power generator 1, since the size of each of the coils 3 is not limited by the beam gap between the magnetostrictive rods 2 and the beam member 73, it is possible to sufficiently increase the size of each of the coils 3 and design the power generator 1 so that the beam gap between the magnetostrictive rods 2 and the beam member 73 becomes sufficiently small. With this configuration, it is possible to increase the size of each of the coils 3 and more uniform the stress generated in each of the magnetostrictive rods 2, thereby improving the power generation efficiency of the power generator 1.

Further, in the power generator 1, the stiffness of the pair of beams constituted of the magnetostrictive rods 2 and the beam member 73 in the displacement direction decreases from the base end side to the tip end side. Thus, it is possible to drastically deform the magnetostrictive rods 2 in the vertical direction with relatively small external force.

In this regard, although a value of the magnitude of the compressive stress generated in each of the magnetostrictive rods 2 in the natural state by the beam member 73 is particularly not limited to a specific value, the range of intensities of the bias magnetic field required for sufficiently ensuring the variation amount of the magnetic flux density generated in each of the magnetostrictive rods 2 is broadened (widened) as the generated compressive stress increases. For example, in the case of using the magnetostrictive material containing the iron-gallium based alloy (having the Young's modulus of about 70 GPa) as the main component thereof as the constituent material for the magnetostrictive rods 2, the compressive stress generated in each of the magnetostrictive rods 2 in the natural state is preferably in the range of about 5 to 50 MPa, and more preferably in the range of about 10 to 40 MPa.

In this regard, an angle formed by the beam member 73 and each of the magnetostrictive rods 2 (taper angle) in the side view is not particularly limited to a specific value, but is preferably in the range of about 0.5 to 7°, and more preferably in the range of about 1 to 4°. If the angle formed by the beam member 73 and each of the magnetostrictive rods 2 is in the above range, it is possible to form the above tapered beam structure with the magnetostrictive rods 2 and the beam member 73 and sufficiently decrease the beam gap between the magnetostrictive rods 2 and the beam member 73 on the base end side. With this configuration, it is possible to generate more uniform stress in each of the magnetostrictive rods 2.

As a constituent material for the connecting portion 7 as described above, it is preferable to use a material which can prevent the magnetic field loop formed by the magnetostrictive rods 2 and the permanent magnets 6 from short-circuiting due to the connecting portion 7 (beam member 73). Thus, although it is preferable that the connecting portion 7 is formed of a weakly magnetic material or a non-magnetic material, it is more preferable from a point of view of more reliably preventing the short-circuit of the magnetic field loop that the connecting portion 7 is formed of the non-magnetic material.

Although a spring constant of the beam member 73 as described above may be different from a spring constant of each of the magnetostrictive rods 2, it is preferable that the spring constant of the beam member 73 is equal to a total value of the spring constants of all of the magnetostrictive rods 2, that is a total value of the spring constants of the two magnetostrictive rods 2. As described above, in this embodiment, the two magnetostrictive rods 2 and the one beam member 73 serve as the pair of beams facing each other. Thus, by using the beam member 73 (connecting portion 7) satisfying the above condition, it is possible to uniform the stiffness in the vertical direction between the beam member 73 and the magnetostrictive rods 2. With this configuration, it is possible to smoothly and reliably displace the second block bodies 5 with respect the first block bodies 4 in the vertical direction.

Further, generally, when external force F is applied to a movable end portion (other end portion) of a cantilevered beam whose one end portion is fixed, a deformation (bending amount) d of the beam can be expressed by the following formula (2).

$$d = FL^3/3EI \quad (2)$$

(wherein "L" is a length of the beam, "E" is a Young's modulus of a constituent material for the beam and "I" is a cross-sectional secondary moment of the beam)

In the power generator 1, cross-sectional areas of each magnetostrictive rod 2 and the beam member 73 are substantially equal to each other as shown in FIG. 3(b). Thus, cross-sectional secondary moments of each magnetostrictive rod 2 and the beam member 73 are also substantially equal to each other. Further, lengths of each magnetostrictive rod 2 and the beam member 73 are substantially equal to each other. Thus, according to the above formula (2), in the case where the power generator 1 takes a configuration in which the number of the beam members 73 is one and the number of the magnetostrictive rods 2 is two, it is preferable that a Young's modulus of the beam member 73 is set to be about twice of a Young's modulus of each magnetostrictive rod 2. With this configuration, each beam (each of the beam member 73 and the two magnetostrictive rods 2) is similarly deformed (bent) by the external force. In other words, it is possible to achieve a good balance among the stiffness of each beam in the vertical direction.

Further, the Young's modulus of the beam member 73 as described above is preferably in the range of about 80 to 200 GPa, more preferably in the range of about 100 to 190 GPa, and even more preferably in the range of about 120 to 180 GPa.

The non-magnetic material having the above Young's modulus is not particularly limited to a specific kind. Examples of such a non-magnetic material include a metallic material, a semiconductor material, a ceramic material, a resin material and a combination of two or more of these materials. In the case of using the resin material as the non-magnetic material, it is preferred that filler is added into the resin material. Among them, a non-magnetic material containing a metallic material as a main component thereof is preferably used. Further, a non-magnetic material containing at least one selected from the group consisting of stainless steel, beryllium copper, aluminum, magnesium, zinc, copper and an alloy containing at least one of these materials as a main component thereof is more preferably used.

In the case of using the magnetostrictive material containing the iron-gallium based alloy (having the Young's modulus of about 70 GPa) as the main component thereof as the constituent material for the magnetostrictive rods 2, it is preferable to use the stainless steel ("SUS 316", having a Young's modulus of about 170 GPa) as the constituent material for the connecting portion 7. By using these materials respectively having these above Young's modulus as the constituent materials for the magnetostrictive rods 2 and the beam member 73, it is possible to achieve a good balance among the stiffness of the beam member 73 and the two magnetostrictive rods 2 in the vertical direction. With this configuration, it is possible to smoothly and reliably displace the second block bodies 5 with respect to the first block bodies 4 in the vertical direction.

A thickness (cross-sectional area) of the beam member 73 as described above is substantially constant. An average thickness of the beam member 73 is not particularly limited to a specific value, but is preferably in the range of about 0.3 to 10 mm, and more preferably in the range of about 0.5 to 5 mm. Further, an average cross-sectional area of the beam member 73 is preferably in the range of about 0.2 to 200 $mm^2$, and more preferably in the range of about 0.5 to 50 $mm^2$.

The air-conditioning duct to which the power generator 1 is fixedly attached is, for example, a duct or a pipe used for forming a flow channel in a device for delivering (discharging, ventilating, inspiring, wasting or circulating) steam, water, fuel oil and gas (such as air and fuel gas). Examples of the pipe and the duct include an air-conditioning duct installed in a big facility, building, station and the like. Further, the vibrating body to which the power generator 1 is attached is not limited to such an air-conditioning duct. Examples of the vibrating body include a transportation (such as a freight train, an automobile and a back of truck), a crosstie (skid) for railroad, a wall panel of an express highway or a tunnel, a bridge, a vibrating device such as a pump and a turbine.

The vibration of the vibrating body is unwanted vibration for delivering an objective medium (in the case of the air-conditioning duct, gas and the like passing through the duct). The vibration of the vibrating body normally results in noise and uncomfortable vibration. In the present invention, by fixedly attaching the power generator 1 to such a vibrating body, it is possible to generate electric energy in the power generator 1 by converting (regenerating) such unwanted vibration (kinetic energy).

The power generator 1 can be utilized for a power supply of a sensor, a wireless communication device and the like. For example, the power generator 1 can be utilized in a system containing a sensor and a wireless communication device. In this system, by utilizing the electric energy (electric power) generated by the power generator 1 to drive the sensor, the sensor can get measured data such as illumination intensity, temperature, humidity, pressure and noise in a facility or a residential space. Further, by utilizing the electric power generated by the power generator 1 to drive the wireless communication device, the wireless communication device can transmit the data measured by the sensor to an external device (such as a server and a host computer) as detected data. The external device can use the measured data as various control signals or a monitoring signal. Furthermore, the power generator 1 can be used for a system for monitoring status of each component of vehicle (for example, a tire pressure sensor and a sensor for seat belt wearing detection). Further, by converting such unwanted vibration of the vibrating body to the electric energy with the power generator 1, it is possible to provide an effect of reducing the noise and the uncomfortable vibration generated from the vibrating body.

Further, in addition to the intended use of regenerating the vibration from the vibrating body as described above, by providing the power generator 1 with a mechanism for directly applying the external force to the tip end portion of the power generator 1 (the second block bodies 5) and combining the power generator 1 with a wireless communication device, it is possible to obtain a switching device which can be manually operated by a user. Such a switching device can function without being wired for a power supply (external power supply) and a signal line. For example, the switching device can be used for a wireless switch for house lighting, a home security system (in particular, a system for wirelessly informing detection of operation of a window or a door) or the like.

Further, by applying the power generator 1 to each switch of a vehicle, it becomes unnecessary to wire the switch for the power supply and the signal line. With such a configuration, it is possible to reduce the number of assembling steps and a weight of a wire provided in the vehicle, thereby achieving weight saving of the vehicle or the like. This makes it possible to suppress a load on a tire, a vehicle body and an engine and contribute to safety of the vehicle.

Although the coils 3 respectively wound around the magnetostrictive rods 2 and the beam member 73 are arranged so as not to overlap with each other in the planar view in the power generator 1 according to this embodiment, it may be possible to take a configuration in which parts of the coils 3 overlap with the beam member 73. Specifically, it may be possible to take a configuration in which the magnetostrictive rods 2 and the beam member 73 do not overlap with each other in the planar view and end portions of the coils 3 and the end portions of the beam member 73 overlap with each other in the planar view. Even in the case of taking such a configuration, it is possible to sufficiently ensure the winding spaces for the coils 3 and sufficiently decrease the beam gap between the magnetostrictive rods 2 and the beam member 73 within a range that the coils 3 and the beam member 73 do not make contact with each other, thereby providing the same effect as the effect provided by the above power generator 1.

The power generation amount of the power generator 1 is not particularly limited to a specific value, but is preferably in the range of about 20 to 2000 μJ. If the power generation amount of the power generator 1 (power generating capability of the power generator 1) is in the above range, it is possible to efficiently utilize the electric power generated by the power generator 1 for the wireless switch for house lighting, the home security system or the like described above in combination with a wireless communication device.

Although the power generator 1 of this embodiment includes the two magnetostrictive rods 2 and the one beam member 73 as the beams facing each other, the present invention is not limited thereto. The present invention may take a configuration as described below.

Figure 11:
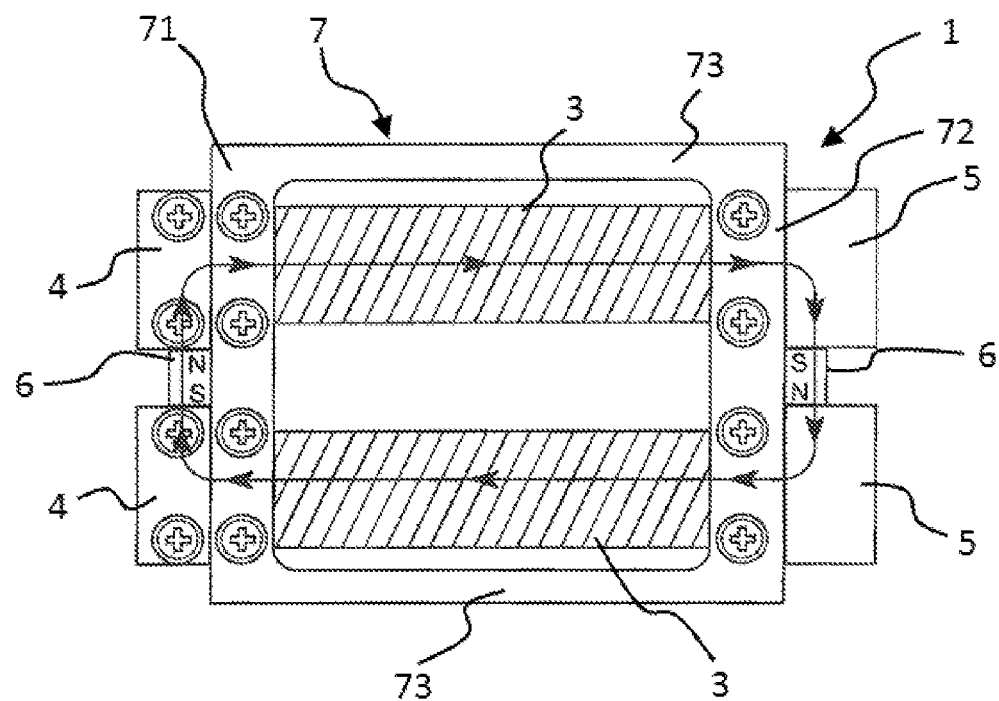
FIG. 11 is a planar view showing another configuration example of the power generator of the first embodiment of the present invention.

FIG. 11 is a planar view showing another configuration example of the power generator of the first embodiment of the present invention.

In the power generator 1 shown in FIG. 11, the connecting portion 7 includes two beam members 73 for respectively connecting the end portions of the first connecting member 71 in the longitudinal direction thereof and the end portions of the second connecting member 72 in the longitudinal direction thereof. In this configuration, since the beam members 73 are arranged on the outer side of the magnetostrictive rods 2, it is possible to increase the size of each of the coils 3 and decrease the gap between the magnetostrictive rods 2, thereby reducing a size of the power generator 1 in the width direction thereof (the vertical direction in FIG. 11). Even in the case of taking this configuration, it is possible to provide the same effect as the effect provided by the described embodiment.

In the above description, the connecting portion 7 is configured so that the length of each beam member 73 is longer than the length from the tip end portions of the first block bodies 4 to the base end portions of the second block bodies 5 in the planar view in a state before the connecting portion 7 is connected to each block body 4, 5. With this configuration, when the connecting portion 7 is connected to each block body 4, 5, the beam member 73 can generate the bias stress in each of the magnetostrictive rods 2 in the natural state. However, the power generator 1 according to this embodiment may take a configuration as described below.

Figure 12:
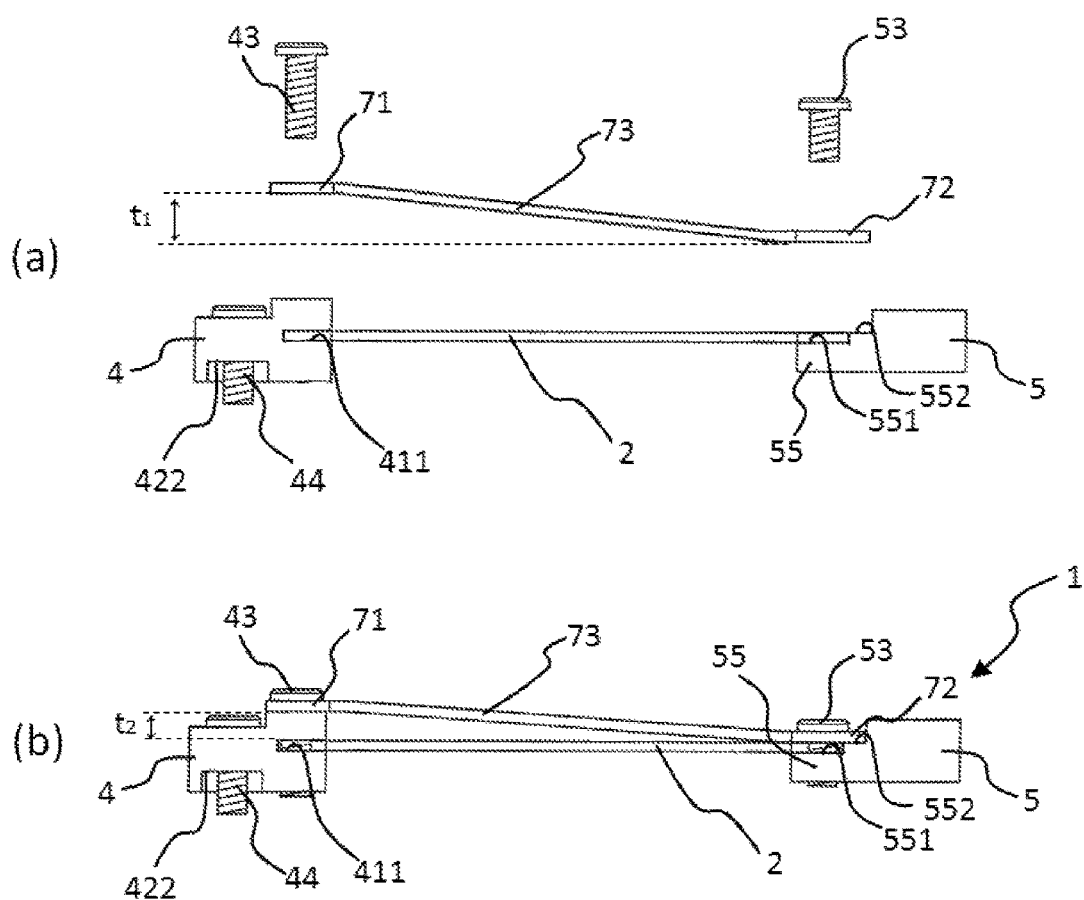
FIG. 12(a) is a right-side view (with the coils being omitted) for explaining a state before a connecting portion is attached to each block body in the other configuration example of the power generator of the first embodiment of the present invention.
FIG. 12(b) is a right-side view (with the coils being omitted) of the other configuration example of the power generator of the first embodiment of the present invention.

FIG. 12(*a*) is a right-side view (with the coils being omitted) for explaining the state before the connecting portion is connected to each block body in the other configuration example of the power generator of the first embodiment of the present invention. FIG. 12(*b*) is a right-side view (with the coils being omitted) of the other configuration example of the power generator of the first embodiment of the present invention.

Hereinafter, an upper side in each of FIGS. 12(*a*) and 12(*b*) is referred to as "upper" or "upper side" and a lower side in each of FIGS. 12(*a*) and 12(*b*) is referred to as "lower" or "lower side". Further, a right side in each of FIGS. 12(*a*) and 12(*b*) is referred to as "tip end side" and a left side in each of 12(*a*) and 12(*b*) is referred to as "base end side".

The power generator 1 shown in FIGS. 12(*a*) and 12(*b*) is configured so that an angle (bending angle) formed by the first connecting member 71 and each beam member 73 and an angle (bending angle) formed by the second connecting member 72 and each beam member 73 are larger than those of the power generator 1 shown in FIG. 3.

As shown in FIG. 12(*a*), in this power generator 1, a difference between the height positions of the first connecting member 71 and the second connecting member 72 (a height from the lower surface of the second connecting member 72 to a lower surface of the first connecting member 71) in the side view in a state before the connecting portion 7 is connected to each block body 4, 5 is "$t_1$". The power generator 1 is configured so that a difference $t_2$ between the height positions of the first connecting member 71 and the second connecting member 72 in the side view in a state that the connecting portion 7 is connected to each block body 4, 5 is smaller than the difference $t_1$ ($t_1 > t_2$) as shown in FIG. 12(b).

By designing the connecting portion 7 so that the angles formed by each connecting member 71, 72 and the beam member 73 become large as described above, the second block bodies 5 are pressed toward the lower direction in FIG. 12(b) by the beam member 73 to displace the second block bodies 5 with respect to the first block bodies 4 in the power generator 1. With this configuration, the base end portions 21 and the tip end portions 22 of the magnetostrictive rods 2 approach to each other in the natural state, thereby generating the compressive stress in each of the magnetostrictive rods 2.

The power generator 1 having the above configuration can also provide the same function and effect as those of the power generator 1 of the described embodiment.

Further, the power generator 1 can take a configuration including two or more of the magnetostrictive rods 2 and one or more of the beam members 73. In the case of changing a total number of the magnetostrictive rods 2 and the beam members 73, it is preferable that this total number is an odd number. Specifically, the power generator 1 can take a configuration in which a ratio of the number of the magnetostrictive rods 2 and the number of the beam members 73 (the number of the magnetostrictive rods 2: the number of the beam members 73) becomes 2:3, 3:2, 3:4, 4:3, 4:5 or the like. In such a configuration, since the magnetostrictive rods 2 and the beam members 73 serving as the beams are symmetrically arranged in the width direction of the power generator 1, it is possible to achieve a good balance among the stress generated in the magnetostrictive rods 2, each block body 4, 5 and the connecting portion 7.

In the case of taking the configuration as described above, when the spring constant of each of the beam members 73 is defined as "A" [N/m], the number of the beam members 73 is defined as "X", the spring constant of each of the magnetostrictive rods 2 is defined as "B" [N/m] and the number of the magnetostrictive rods 2 is defined as "Y", it is preferable that the power generator 1 is configured so that a value of "A×X" is substantially equal to a value of "B×Y". With this configuration, it is possible to smoothly and reliably displace the second block bodies 5 with respect to the first block bodies 4 in the vertical direction.

In the above description, the connections between the both end portions 21, 22 of the magnetostrictive rods 2 and each block body 4, 5 and the connections between the connecting portion 7 and each block body 4, 5 are achieved by screwing the male screws 43, 53 into the female screw portions 412, 553, but the fixing and connecting method for each component is not limited to this screwing method. Examples of the fixing and connecting method for each component include a caulking method, a diffusion bonding method, a pin pressure fitting method, a brazing method, a welding method (such as a laser welding method and an electric welding method) and a bonding method with an adhesive agent.

Second Embodiment

Next, description will be given to a second embodiment of the power generator of the present invention.

Figure 13:
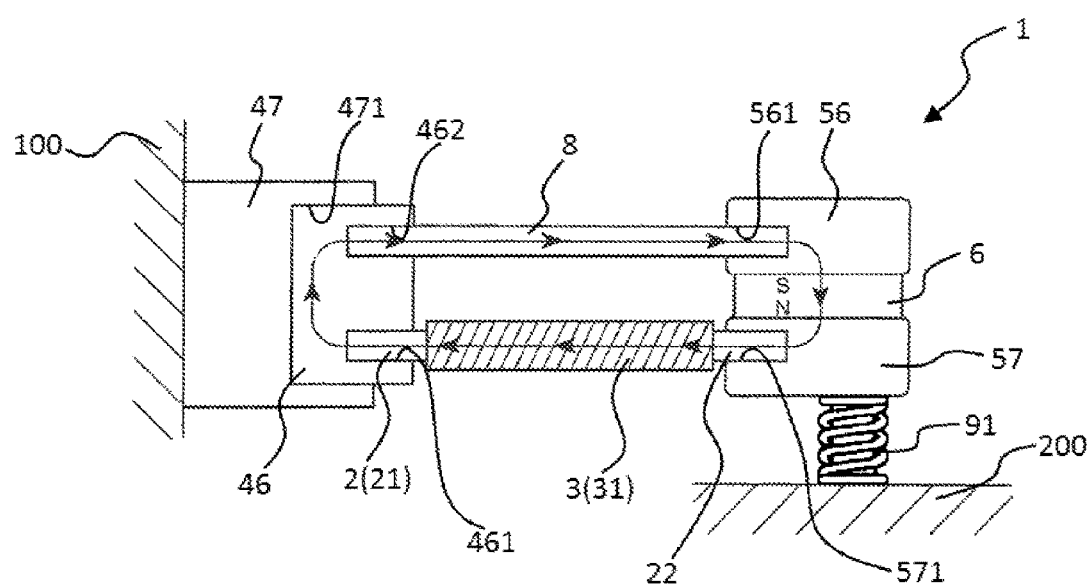
FIG. 13 is a side view showing a second embodiment of the power generator of the present invention.
Figure 14:
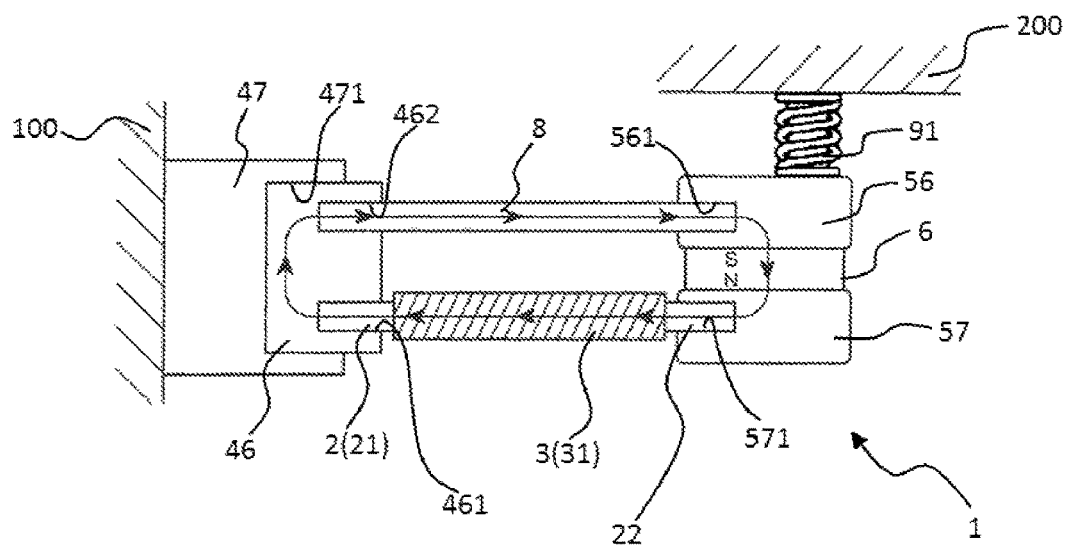
FIG. 14 is a side view showing another configuration example of the power generator of the second embodiment of the present invention.

FIG. 13 is a side view showing the second embodiment of the power generator of the present invention. FIG. 14 is a side view showing another configuration example of the power generator of the second embodiment of the present invention.

Hereinafter, an upper side in each of FIGS. 13 and 14 is referred to as "upper" or "upper side" and a lower side in each of FIGS. 13 and 14 is referred to as "lower" or "lower side". Further, a right side in each of FIGS. 13 and 14 is referred to as "tip end side" and a left side in each of FIGS. 13 and 14 is referred to as "base end side".

Hereinafter, the power generator according to the second embodiment will be described by placing emphasis on the points differing from the power generator according to the first embodiment, with the same matters being omitted from the description.

The power generator 1 shown in FIG. 13 includes the magnetostrictive rod 2 around which the coil 3 is wound, a beam member 8 arranged along the magnetostrictive rod 2, a connecting yoke 46 connecting the base end portion 21 of the magnetostrictive rod 2 and a base end portion of the beam member 8, connecting yokes 56, 57 respectively provided on the tip end portion 22 of the magnetostrictive rod 2 and a tip end portion of the beam member 8 and a permanent magnet 6 provided between the connecting yokes 56, 57. Further, the connecting yoke 46 provided on the base end side is fixed to a supporting portion 47 and a coil spring 91 is provided on the lower side of the connecting yoke 57.

The magnetostrictive rod 2 and the coil 3 used in this embodiment may be same as the magnetostrictive rod 2 and the coil 3 used in the first embodiment.

The beam member 8 is formed of a magnetic material and has a function of generating the stress in the magnetostrictive rod 2.

A constituent material for the beam member 8 may be the same material as the above-mentioned various materials to be used for forming the first block bodies 4 and the second block bodies 5 in the described first embodiment.

Further, it is preferable that an average thickness of the beam member 8 is substantially equal to the thickness of the beam member 73 in the described first embodiment.

The connecting yoke 46 connects the base end portion 21 of the magnetostrictive rod 2 and the base end portion of the beam member 8.

Upper and lower slits 461, 462 are formed on the connecting yoke 46 so as to extend along a width direction of the connecting yoke 46. The base end portion 21 of the magnetostrictive rod 2 is inserted into the lower slit 461 of the connecting yoke 46 and the base end portion of the beam member 73 is inserted into the upper slit 462 of the connecting yoke 46 to fix the magnetostrictive rod 2 and the beam member 73 to the connecting yoke 46.

A base end portion of the connecting yoke 46 is fixed to the supporting portion 47.

The supporting portion 47 has a plate-like shape. Further, a groove portion 471 is formed in a substantially central portion of the supporting portion 47 on the tip end side thereof so as to pass through the supporting portion 47 in a width direction thereof. The connecting yoke 46 is inserted into this groove portion 471 to fix the connecting yoke 46 to the supporting portion 47.

In the power generator 1 according to this embodiment, the base end portion of the supporting portion 47 is fixed to a housing 100 of a vibrating body to support the magnetostrictive rod 2 in a cantilevered state that the base end portion 21 of the magnetostrictive rod 2 serves as a fixed end portion and the tip end portion 22 of the magnetostrictive rod 2 serves as a movable end portion.

The connecting yoke 56 is provided on the tip end side of the beam member 8.

A slit 561 is formed on a substantially central portion of the connecting yoke 56 in a thickness direction thereof so as to extend along a width direction of the connecting yoke 56. The tip end portion of the beam member 8 is inserted into this slit 561 to fix the connecting yoke 56 to the beam member 8.

The connecting yoke 57 is provided on the tip end side of the magnetostrictive rod 2.

A slit 571 is formed on a substantially central portion of the connecting yoke 57 in a thickness direction thereof so as to extend along a width direction of the connecting yoke 57. The tip end portion 22 of the magnetostrictive rod 2 is inserted into this slit 571 to fix the connecting yoke 57 to the magnetostrictive rod 2.

The permanent magnet 6 is provided between the connecting yokes 56, 57.

The permanent magnet 6 has a columnar shape. A constituent material for the permanent magnet 6 may be same as the constituent material for the permanent magnets 6 in the described first embodiment.

In this embodiment, the permanent magnet 6 is arranged so that its south pole is directed toward the side of the connecting yoke 56 and its north pole is directed toward the side of the connecting yoke 57 as shown in FIG. 13. With this configuration, it is possible to form a magnetic field loop circulating in the clockwise direction in the power generator 1.

In the power generator 1 according to this embodiment, the connecting yokes 56, 57 and the permanent magnet 6 serve as a weight for applying external force or vibration to the magnetostrictive rod 2. When the vibrating body vibrates, external force or vibration in the vertical direction in FIG. 13 is applied to these components. By applying the external force or the vibration to these components, the tip end portion 22 of the magnetostrictive rod 2 begins reciprocating motion in the vertical direction in the cantilevered state that the base end portion 21 of the magnetostrictive rod 2 serves as the fixed end portion and the tip end portion 22 of the magnetostrictive rod 2 serves as the movable end portion. Namely, the tip end portion 22 of the magnetostrictive rod 2 is relatively displaced with respect to the base end portion 21 of the magnetostrictive rod 2.

A constituent material for each connecting yoke 46, 56, 57 and the supporting portion 47 may be the same material as the above-mentioned various materials to be used for forming the first block bodies 4 and the second block bodies 5 in the described first embodiment.

The coil spring 91 is provided on the lower side of the connecting yoke 57.

The coil spring 91 is arranged between the connecting yoke 57 and a base body 200 (which does not vibrate) in an expanded state (that is a state that the coil spring 91 is expanded in a longitudinal direction thereof from a natural state). One end portion of the coil spring 91 is fixed to a lower surface of the connecting yoke 57 and the other end portion of the coil spring 91 is fixed to the base body 200.

In the power generator 1, the magnetostrictive rod 2 (the connecting yoke 57) is pulled toward a lower side of a displacement direction of the coil spring 91 (the lower direction in FIG. 13) by the coil spring 91 as shown in FIG. 13. With this configuration, the compressive stress is generated in the magnetostrictive rod 2. In this embodiment, the coil spring 91 constitutes the bias stress generating mechanism for generating the compressive stress in the magnetostrictive rod 2 in all states (containing the natural state and a state that the external force is applied to the power generator 1).

Even in the case where the power generator 1 takes such a configuration, the compressive stress is generated in the magnetostrictive rod 2 in the natural state as is the case for the power generator 1 of the described first embodiment. Thus, even if the intensity of the bias magnetic field applied to the magnetostrictive rod 2 is relatively large, it is possible to sufficiently increase the variation amount of the magnetic flux density in the magnetostrictive rod 2. Namely, according to the power generator 1 of this embodiment, it is also possible to sufficiently increase the variation amount of the magnetic flux density in the magnetostrictive rod 2 in a wide range of intensities of the bias magnetic field.

In this embodiment, it may be possible to take a configuration in which the coil spring 91 in a contracted state (that is a state that the coil spring 91 is contracted in the longitudinal direction thereof from the natural state) is arranged between the connecting yoke 56 and the base body 200 and the both end portions of the coil spring 91 are respectively fixed to an upper surface of the connecting yoke 56 and the base body 200 as shown in FIG. 14. In such a configuration, the magnetostrictive rod 2 is pressed toward the lower side of the displacement direction of the coil spring 91 (the lower direction in FIG. 14) by the coil spring 91. With this configuration, the compressive stress is generated in the magnetostrictive rod 2, thereby providing the same function and effect as the described function and effect of the power generator 1 of this embodiment.

In this embodiment, it is possible to take a configuration in which the coil 3 is wound around the beam member 8 instead of winding the coil 3 around the magnetostrictive rod 2. When the magnetic flux density in the magnetostrictive rod 2 varies, the magnetic flux density passing through the beam member 8 also varies. Thus, it is possible to generate the voltage in the coil 3 as is the case for the power generator 1 having the above configuration.

For fixing and connecting each component, it is possible to use a screwing method, a caulking method, a diffusion bonding method, a pin pressure fitting method, a brazing method, a welding method (such as a laser welding method and an electric welding method), a bonding method with an adhesive agent or the like.

Further, it is also possible to use an elastic member having the same function as the coil spring 91 instead of the coil spring 91 described above. For example, a leaf spring in the expanded state may be used in the power generator 1 shown in FIG. 13 instead of the coil spring 91.

The power generator 1 according to this second embodiment can also provide the same function and effect as the function and effect of the power generator 1 according to the described first embodiment.

Third Embodiment

Next, description will be given to a third embodiment of the power generator of the present invention.

Figure 15:
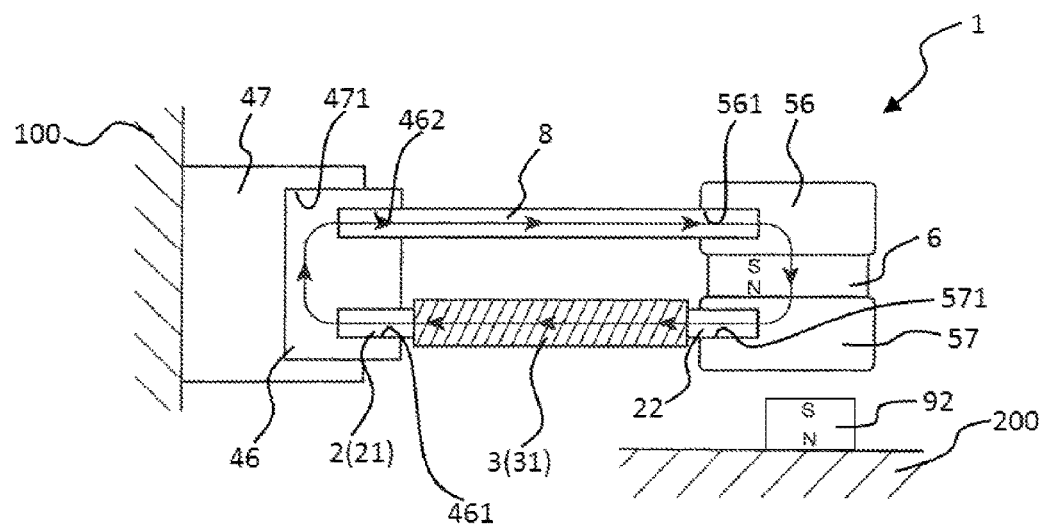
FIG. 15 is a side view showing a third embodiment of the power generator of the present invention.

FIG. 15 is a side view showing the third embodiment of the power generator of the present invention.

Hereinafter, an upper side in FIG. 15 is referred to as "upper" or "upper side" and a lower side in FIG. 15 is referred to as "lower" or "lower side". Further, a right side in FIG. 15 is referred to as "tip end side" and a left side in FIG. 15 is referred to as "base end side".

Hereinafter, the power generator according to the third embodiment will be described by placing emphasis on the points differing from the power generators according to the first embodiment and the second embodiment, with the same matters being omitted from the description.

The power generator 1 shown in FIG. 15 has the same configuration as the power generator 1 according to the second embodiment except that a magnet 92 is arranged between the connecting yoke 57 and the base body 200 instead of the coil spring 91.

As shown in FIG. 15, the magnet 92 is arranged on the base body 200 so as to be spaced apart from the connecting yoke 57 in the natural state. Further, the magnet 92 is configured to overlap with the connecting yoke 57 in the planar view.

This magnet 92 has a columnar shape. The magnet 92 is formed of the same material as the constituent material for the permanent magnets 9 of the described first embodiment. The magnet 92 is arranged so that its south pole is directed toward the side of the connecting yoke 57 and its north pole is directed toward the side of the base body 200.

Since the connecting yoke 57 in the power generator 1 is formed of the magnetic material, the connecting yoke 57 is attracted toward the lower side of the displacement direction of the magnetostrictive rod 2 (the lower direction in FIG. 15) by the magnet 92. With this configuration, the compressive stress is generated in the magnetostrictive rod 2. In this embodiment, the magnet 92 and the connecting yoke 57 (magnetic member) constitute the bias stress generating mechanism for generating the compressive stress in the magnetostrictive rod 2 in all states.

Even in the case where the power generator 1 takes such a configuration, the compressive stress is generated in the magnetostrictive rod 2 in the natural state as is the cases for the power generators 1 of the first embodiment and the second embodiment. Thus, even if the intensity of the bias magnetic field applied to the magnetostrictive rod 2 is relatively large, it is possible to sufficiently increase the variation amount of the magnetic flux density in the magnetostrictive rod 2. Namely, according to the power generator 1 of this embodiment, it is also possible to sufficiently increase the variation amount of the magnetic flux density in the magnetostrictive rod 2 in a wide range of intensities of the bias magnetic field.

Further, although the magnet 92 is arranged so as to overlap with the connecting yoke 57 in the planar view, it is preferable from a point of view of preventing the lines of magnetic force generated from the magnet 92 from interfering with the magnetic field loop formed in the power generator 1 that the magnet 92 is arranged so as to overlap with a part of the connecting yoke 57 on the base end side in the planar view.

In this regard, although the magnet 92 is arranged on the base body 200 so that its south pole is directed toward the side of the connecting yoke 57 in the power generator 1 shown in FIG. 15, the magnet 92 may be arranged on the base body 200 so that its north pole is directed toward the side of the connecting yoke 57.

The power generator 1 according to this third embodiment can also provide the same function and effect as the functions and effects of the power generators 1 according to the first embodiment and the second embodiment.

Forth Embodiment

Next, description will be given to a fourth embodiment of the power generator of the present invention.

Figure 16:
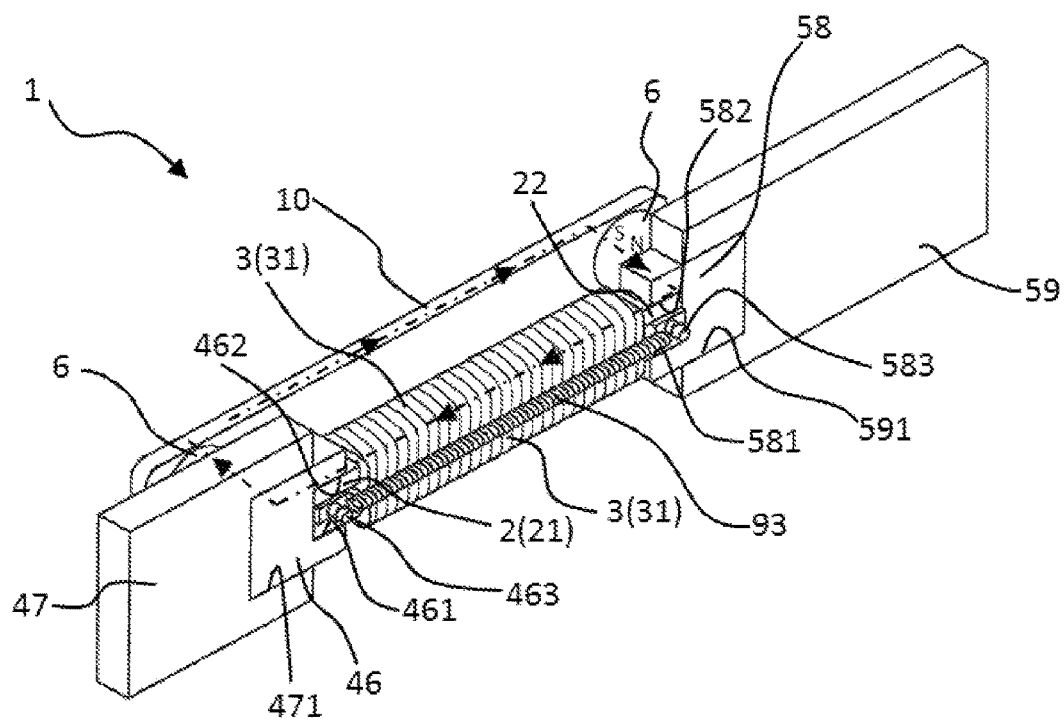
FIG. 16 is a perspective view showing a fourth embodiment of the power generator of the present invention.
Figure 17:
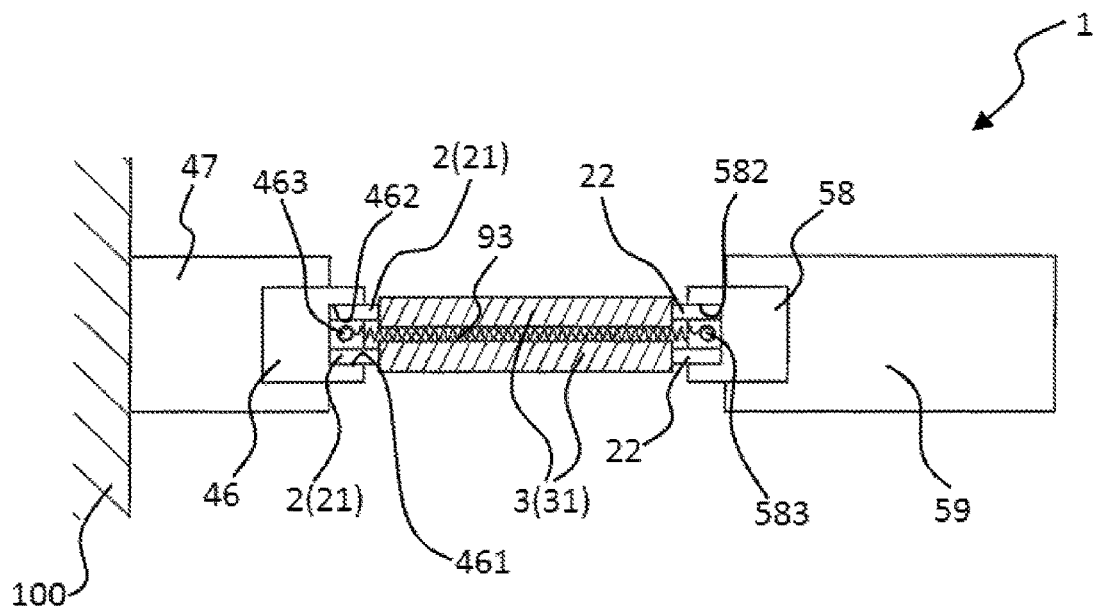
FIG. 17 is a side view of the power generator shown in FIG. 16.
Figure 18:
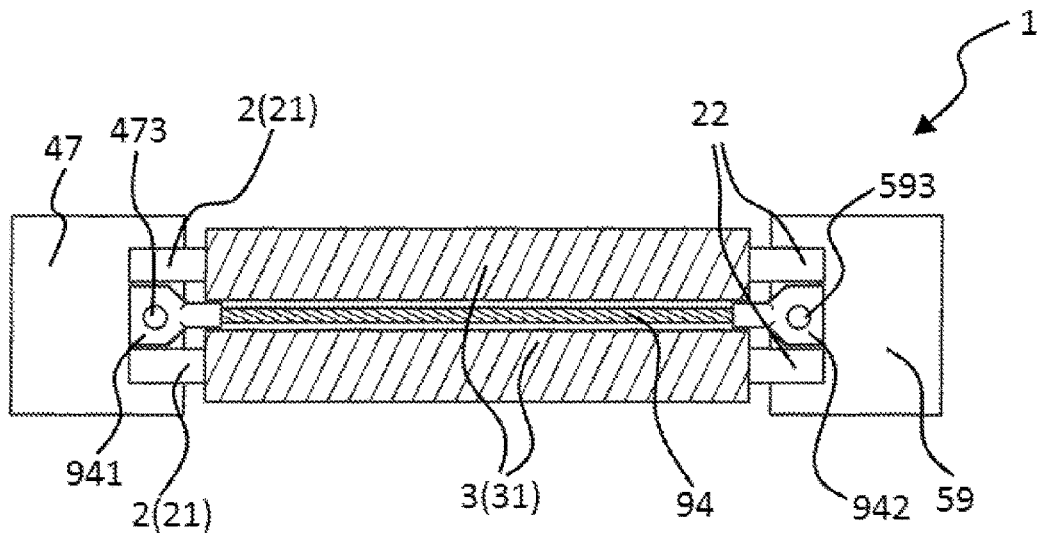
FIG. 18 is a side view showing another configuration example of the power generator of the fourth embodiment of the present invention.

FIG. 16 is a perspective view showing the fourth embodiment of the power generator of the present invention. FIG. 17 is a side view of the power generator shown in FIG. 16. FIG. 18 is a side view showing another configuration example of the power generator of the fourth embodiment of the present invention.

Hereinafter, an upper side in each of FIGS. 16 to 18 is referred to as "upper" or "upper side" and a lower side in each of FIGS. 16 to 18 is referred to as "lower" or "lower side". Further, a right and rear side of the paper in FIG. 16 and a right side of each of FIGS. 17 and 18 are referred to as "tip end side" and a left and front side of the paper in FIG. 16 and a left side in each of FIGS. 17 and 18 are referred to as "base end side".

Hereinafter, the power generator according to the fourth embodiment will be described by placing emphasis on the points differing from the power generators according to the first embodiment to the third embodiment, with the same matters being omitted from the description.

The power generator 1 shown in FIG. 16 includes the two magnetostrictive rods 2 arranged side by side, the coils 3 respectively wound around the magnetostrictive rods 2, the connecting yoke 46 for connecting the base end portions 21 of the magnetostrictive rods 2 with each other, a connecting yoke 58 for connecting the tip end portions 22 of the magnetostrictive rods 2 with each other, a yoke 10 arranged along the magnetostrictive rods 2 and the two permanent magnets 6 respectively arranged between the connecting yoke 46 and the yoke 10 and between the connecting yoke 58 and the yoke 10. Further, the connecting yoke 46 provided on the base end side is fixed to the supporting portion 47 and the connecting yoke 58 provided on the tip end side is fixed to a weight portion (mass portion) 59.

In the power generator 1 according to this embodiment, the bias stress generating mechanism is constituted of a pair of coil springs 93 respectively provided on the front side and the rear side of the magnetostrictive rods 2 in FIG. 17 so as to face each other through the two magnetostrictive rods 2.

In this regard, the magnetostrictive rods 2 and the coils 3 used in this embodiment may be same as the magnetostrictive rods 2 and the coils 3 used in the first embodiment.

The connecting yoke 46 connects the base end portions 21 of the magnetostrictive rods 2.

As is the case for the connecting yoke 46 of the described second embodiment, the upper and lower slits 461, 462 are formed on the connecting yoke 46 so as to extend along the width direction of the connecting yoke 46. The base end portions 21 of the magnetostrictive rods 2 are respectively inserted into the upper and lower slits 461, 462 to fix the magnetostrictive rods 2 to the connecting yoke 46. Further, bars 463 (a pair of bars 463) are respectively formed on both side surfaces of the connecting yoke 46 so as to be positioned between the upper and lower slits 461, 462.

The connecting yoke 46 is fixed to the supporting portion 47 on the base end side of the supporting portion 47. The supporting portion 47 has the same configuration as that of the described second embodiment.

The connecting yoke 58 connects the tip end portions 22 of the magnetostrictive rods 2.

Upper and lower slits 581, 582 are formed on the connecting yoke 58 so as to extend along a width direction of the connecting yoke 58. The tip end portions 22 of the magnetostrictive rods 2 are respectively inserted into the upper and lower slits 581, 582 to fix the connecting yoke 58 to the magnetostrictive rods 2. Further, bars 583 (a pair of bars 583) are respectively formed on both side surfaces of the connecting yoke 56 so as to be positioned between the upper and lower slits 581, 582.

The connecting yoke 58 is fixed to the weight portion 59 on the tip end side of the connecting yoke 58.

The weight portion 59 has a plate-like shape. A groove portion 591 is formed in a substantially central portion of the weight portion 59 on the base end side thereof so as to pass through the weight portion 59 in a width direction thereof. The connecting yoke 58 is inserted into this groove portion 591 to fix the weight portion 59 to the connecting yoke 58.

The weight portion 59 and the connecting yoke 58 serve as a weight for applying external force or vibration to the magnetostrictive rods 2. When the vibrating body vibrates, external force or vibration in the vertical direction in FIG. 17 is applied to the weight portion 59 and the connecting yoke 58. By applying the external force or the vibration to the weight portion 59 and the connecting yoke 58, the tip end portions 22 of the magnetostrictive rods 2 begin reciprocating motion in the vertical direction in the cantilevered state that the base end portions 21 of the magnetostrictive rods 2 serve as the fixed end portions and the tip end portions 22 of the magnetostrictive rods 2 serve as the movable end portions. Namely, the tip end portions 22 of the magnetostrictive rods 2 are relatively displaced with respect to the base end portions 21 of the magnetostrictive rods 2.

A constituent material for each connecting yoke 46, 58, the supporting portion 47 and the weight portion 59 may be the same material as the above-mentioned various materials to be used for forming the first block bodies 4 and the second block bodies 5 in the described first embodiment.

The yoke 10 has an elongated plate-like shape. The yoke 10 is arranged along the two magnetostrictive rods 2 in the width direction thereof. A constituent material for the yoke 10 may be the same material as the above-mentioned various materials to be used for forming the first block bodies 4 and the second block bodies 5 in the described first embodiment.

Each of the permanent magnets 6 has a columnar shape. A constituent material for the permanent magnets 6 may be same as the constituent material for the permanent magnets 6 in the described first embodiment.

In this embodiment, as shown in FIG. 16, the permanent magnet 6 arranged between the connecting yoke 46 and the yoke 10 is arranged so that its south pole is directed toward the side of the connecting yoke 46 and its north pole is directed toward the side of the yoke 10. On the other hand, the permanent magnet 6 arranged between the connecting yoke 58 and the yoke 10 is arranged so that its south pole is directed toward the side of the yoke 10 and its north pole is directed toward the side of the connecting yoke 58. With this configuration, it is possible to form a magnetic field loop circulating in the clockwise direction in the power generator 1.

The coil springs 93 are respectively provided on the front side and the rear side of the paper in FIG. 17 so as to face each other through the two magnetostrictive rods 2.

One end portion of each of the coil springs 93 is fixed to the bar 463 of the connecting yoke 46 in the expanded state. The other end portion of each of the coil springs 93 is fixed to the bar 583 of the connecting yoke 58 in the expanded state.

In the power generator 1, the connecting yokes 46, 58 are pulled by the coil springs 93 in a direction in which the connecting yokes 46, 58 approach to each other. Namely, the base end portions 21 and the tip end portions 22 of the magnetostrictive rods 2 are pulled by the coil springs 93 in a direction in which the tip end portions 22 approach to the base end portions 21. With this configuration, the compressive stress is generated in each of the magnetostrictive rods 2. In this embodiment, the coil springs 93 constitute the bias stress generating mechanism for generating the compressive stress in each of the magnetostrictive rods 2 in all states.

Even in the case where the power generator 1 takes such a configuration, the compressive stress is generated in each of the magnetostrictive rods 2 in the natural state as is the cases for the power generators 1 of the first embodiment to the third embodiment. Thus, even if the intensity of the bias magnetic field applied to the magnetostrictive rods 2 is relatively large, it is possible to sufficiently increase the variation amount of the magnetic flux density in each of the magnetostrictive rods 2. Namely, according to the power generator 1 of this embodiment, it is also possible to sufficiently increase the variation amount of the magnetic flux density in each of the magnetostrictive rods 2 in a wide range of intensities of the bias magnetic field.

In this embodiment, it is possible to use other elastic members for generating the compressive stress in each of the magnetostrictive rods 2 in the natural state instead of the coil springs 93.

For example, a wire 94 as shown in FIG. 18 can be used as the elastic member. The power generator 1 shown in FIG. 18 has a configuration in which the base end portions 21 of the magnetostrictive rods 2 are connected by the supporting portion 47 and the tip end portions 22 of the magnetostrictive rods 2 are connected by the weight portion 59. The yoke 10 is fixed to the supporting portion 47 and the weight portion 59 on the rear side of the paper in FIG. 18 through the two permanent magnets 6.

For example, the wire 94 is formed of a metallic wire. Both end portions of the wire 94 are respectively fixed to fixing portions 941, 942 with a caulking method or the like. A through-hole is formed in each of the fixing portions 941, 942 so as to pass through each of the fixing portions 941, 942 in a thickness direction thereof. Bars 473, 593 are respectively provided on the supporting portion 47 and the weight portion 59. The bars 473, 593 are respectively inserted into the through-holes of the fixing portions 941, 942 to respectively fix the fixing portions 941, 942 to the supporting portion 47 and the weight portion 59.

For example, in the power generator 1 described above, by designing the power generator 1 so that a length of the wire 94 is shorter than a length from a tip end portion of the supporting portion 47 to a base end portion of the weight portion 59, the base end portions 21 and the tip end portions 22 of the magnetostrictive rods 2 are pulled in a direction in which the tip end portions 22 approach to the base end portions 21 as is the case for the described embodiment using the coil springs 93. With this configuration, it is possible to generate the compressive stress in each of the magnetostrictive rods 2 in all states.

Further, by fixing the fixing portions 941, 942 to the bars 473, 593 in a state that the wire 94 is heated by a heating treatment and then cooling the wire 94 for generating heat-shrinking in the wire 94, the base end portions 21 and the tip end portions 22 of the magnetostrictive rods 2 are pulled in the direction in which the tip end portions 22 approach to the base end portions 21. Furthermore, in the case of using a shape-memory wire having a length shorter than the length from the tip end portion of the supporting portion 47 to the base end portion of the weight portion 59 as the wire 94, the fixing portions 941, 942 are first fixed to the bars 473, 593 in a state that the wire 94 is heated and expanded. Then, the wire 94 is cooled to a certain temperature. At this time, since the wire 94 starts to return to an original shape, the base end portions 21 and the tip end portions 22 of the magnetostrictive rods 2 are pulled in the direction in which the tip end portions 22 approach to the base end portions 21. Even in the case of using any one of the above methods, it is possible to generate the compressive stress in each of the magnetostrictive rods 2.

For fixing and connecting each component, it is possible to use a screwing method, a caulking method, a diffusion bonding method, a pin pressure fitting method, a brazing method, a welding method (such as a laser welding method and an electric welding method), a bonding method with an adhesive agent or the like.

Further, in this embodiment, it is possible to take a configuration in which the coil 3 is wound around the yoke 10 instead of winding the coils 3 around the magnetostrictive rods 2. When the magnetic flux density in each of the magnetostrictive rods 2 varies, the magnetic flux density passing through the yoke 10 also varies. Thus, it is possible to generate the voltage in the coil 3 as is the case for the power generator 1 having the above configuration.

The power generator 1 according to this fourth embodiment can also provide the same function and effect as the functions and effects of the power generators 1 according to the first embodiment to the third embodiment.

Although the power generator of the present invention has been described with reference to the preferred embodiments shown in the accompanying drawings, the present invention is not limited thereto. In the power generator, the configuration of each component may be possibly replaced with other arbitrary configurations having equivalent functions. It may be also possible to add other optional components to the present invention.

For example, it may be also possible to combine the configurations according to the first embodiment to the fourth embodiment of the present invention in an appropriate manner.

Further, in the first embodiment, it is possible to omit one of the two permanent magnets or replace one or both of the permanent magnets with an electromagnet. Furthermore, it is possible to take a configuration in which both of the permanent magnets are omitted and the power generator generates the electric power with utilizing an external magnetic field.

Further, it is possible to replace the permanent magnet 6 and the magnet 92 in the second embodiment to the fourth embodiment with electromagnets. Furthermore, it is also possible to take a configuration in which one of the permanent magnet 6 and the magnet 92 is omitted and the power generator generates the electric power with utilizing an external magnetic field.

Further, although each of the magnetostrictive rods and the beam member has the rectangular cross-sectional shape in each of the embodiments, the present invention is not limited thereto. Examples of the cross-sectional shape of each of the magnetostrictive rods and the beam member include a circular shape, an ellipse shape and a polygonal shape such as a triangular shape, a square shape and a hexagonal.

Further, although the permanent magnet in each of the embodiments has the columnar shape, the present invention is not limited thereto. Examples of the shape of the permanent magnet include a square columnar shape, a plate-like shape and a triangle pole shape.

INDUSTRIAL APPLICABILITY

According to the present invention, since the compressive stress (contraction stress) is generated in the magnetostrictive rod in the natural state (that is a state that external force is not applied to the power generator), the magnetic permeability of the magnetostrictive rod is lower than the case where the stress does not occur in the magnetostrictive rod. Thus, in this power generator, it is possible to increase the variation amount of the magnetic flux density caused by the generation of the tensile stress (stretching stress) in the magnetostrictive rod and sufficiently increase the variation amount of the magnetic flux density in the magnetostrictive rod when the tensile stress and the compressive stress are alternately generated in the magnetostrictive rod. For the reasons stated above, the present invention is industrially applicable.

What is claimed is:

1. A power generator comprising:
    a magnetostrictive rod through which lines of magnetic force pass in an axial direction thereof, the magnetostrictive rod formed of a magnetostrictive material;
    a coil arranged so that the lines of magnetic force pass inside the coil in an axial direction of the coil whereby a voltage is generated in the coil due to variation of density of the lines of magnetic force; and
    a bias stress generating mechanism for generating compressive stress in the magnetostrictive rod in a natural state,
    wherein the magnetostrictive rod has one end portion and the other end portion, and
    wherein the power generator is configured to generate the voltage in the coil due to the variation of the density of the lines of magnetic force when the other end portion of the magnetostrictive rod is displaced with respect to the one end portion of the magnetostrictive rod in a direction substantially perpendicular to the axial direction of the magnetostrictive rod to expand and contract the magnetostrictive rod, wherein the bias stress generating mechanism includes a beam member which is arranged along the magnetostrictive rod and allows the one end portion and the other end portion of the magnetostrictive rod to approach to each other to generate the compressive stress in the magnetostrictive rod.

2. The power generator as claimed in claim 1, wherein a gap between the beam member and the magnetostrictive rod on the side of the other end portion of the magnetostrictive rod is smaller than a gap between the beam member and the magnetostrictive rod on the side of the one end portion of the magnetostrictive rod in a side view.

3. The power generator as claimed in claim 1, wherein the beam member is formed of a non-magnetic material.

4. The power generator as claimed in claim 1, wherein the magnetostrictive rod includes two or more of magnetostrictive rods arranged side by side, and
    wherein the two or more of magnetostrictive rods are arranged so as not to overlap with the beam member in a planar view.

5. The power generator as claimed in claim 4, wherein the beam member is arranged between the magnetostrictive rods in the planar view.

6. The power generator as claimed in claim 1, wherein the bias stress generating mechanism further includes a magnetic member provided on the side of the other end portion of the magnetostrictive rod and a magnet for attracting the magnetic member so as to generate the compressive stress in the magnetostrictive rod.

7. The power generator as claimed in claim 1, further comprising:

a first block body including a receiving portion for receiving the one end portion of the magnetostrictive rod, the first block body formed of a magnetic material; and a second block body including a receiving portion for receiving the other end portion of the magnetostrictive rod, the second block body formed of a magnetic material.

8. The power generator as claimed in claim 1, wherein the coil is wound around the magnetostrictive rod.

* * * * *